United States Patent
Hara et al.

(10) Patent No.: US 8,003,509 B2
(45) Date of Patent: Aug. 23, 2011

(54) SEMICONDUCTOR MANUFACTURING APPARATUS AND SEMICONDUCTOR MANUFACTURING METHOD

(75) Inventors: Kenichi Hara, Yamanashi (JP);
Mitsuaki Iwashita, Yamanashi (JP);
Takashi Tanaka, Yamanashi (JP);
Takayuki Toshima, Kumamoto (JP);
Takehiko Orii, Saga (JP)

(73) Assignee: Tokyo Electron Limited, Tokyo (JP)

( * ) Notice: Subject to any disclaimer, the term of this patent is extended or adjusted under 35 U.S.C. 154(b) by 233 days.

(21) Appl. No.: 12/405,644

(22) Filed: Mar. 17, 2009

(65) Prior Publication Data

US 2009/0253258 A1 Oct. 8, 2009

(30) Foreign Application Priority Data

Apr. 4, 2008 (JP) ................................ 2008-098367

(51) Int. Cl.
*H01L 21/44* (2006.01)
(52) U.S. Cl. ..................... 438/597; 204/275.1; 427/240; 427/299; 427/352; 427/421.1; 427/427
(58) Field of Classification Search ........................ None
See application file for complete search history.

(56) References Cited

U.S. PATENT DOCUMENTS

2004/0182277 A1* 9/2004 Inoue et al. ................... 106/1.22
2006/0113185 A1* 6/2006 Kuriyama et al. ......... 204/275.1

FOREIGN PATENT DOCUMENTS

JP 2007-177324 A 7/2007

OTHER PUBLICATIONS

Japanese Office action for 2008-098367 dated Apr. 20, 2010.

* cited by examiner

*Primary Examiner* — Matthew C Landau
*Assistant Examiner* — Sonya D McCall Shepard
(74) *Attorney, Agent, or Firm* — Pearne & Gordon LLP

(57) ABSTRACT

A plated film having a uniform film thickness is formed on a surface of a substrate. A semiconductor manufacturing apparatus includes: a holding mechanism for holding a substrate rotatably; a nozzle for supplying a processing solution for performing a plating process on a processing target surface of the substrate; a substrate rotating mechanism for rotating the substrate held by the holding mechanism in a direction along the processing target surface; a nozzle driving mechanism for moving the nozzle in a direction along the processing target surface at a position facing the processing target surface of the substrate held by the holding mechanism; and a control unit for controlling the supply of the processing solution by the nozzle and the movement of the nozzle by the nozzle driving mechanism.

11 Claims, 17 Drawing Sheets

RELATIONSHIP BETWEEN SUPPLY POSITION OF PLATING PROCESSING SOLUTION AND THICKNESS OF PLATED FILM

SEMICONDUCTOR MANUFACTURING APPARATUS AND SEMICONDUCTOR MANUFACTURING METHOD

FIELD OF THE INVENTION

The present disclosure relates to a semiconductor manufacturing apparatus and a semiconductor manufacturing method for forming a cap metal on a wiring formed on, e.g., a substrate as a target object; and, more particularly, to a semiconductor manufacturing apparatus and a semiconductor manufacturing method capable of forming a cap metal on a surface of the target object in a uniform thickness.

BACKGROUND OF THE INVENTION

In the design and manufacture of a semiconductor device, there has been an increasing demand for a higher operating speed and a higher level of integration. Meanwhile, it has been pointed out that electro-migration (EM) easily occurs due to a current density increase caused by a high-speed operation and wiring miniaturization, whereby wiring disconnection may be caused. This results in deterioration of reliability. For this reason, Cu (copper), Ag (silver) or the like having a low resistivity has been used as a wiring material formed on a substrate of the semiconductor device. Especially, since the copper has a resistivity of about 1.8 $\mu\Omega \cdot cm$ and is expected to exhibit high EM tolerance, it is regarded as a material suitable for achieving the high speed of the semiconductor device.

In general, a damascene method has been utilized to form a copper wiring on the substrate, and this method involves forming a via and a trench on an insulating film by etching, and then filling them with a Cu wiring. Further, there has been made an attempt to enhance the EM tolerance of the semiconductor device by coating a metal film called a cap metal on the Cu wiring by electroless plating by means of supplying a plating solution containing CoWB (cobalt•tungsten•boron), CoWP (cobalt•tungsten•phosphorus), or the like on the surface of the substrate having the Cu wiring (see, for example, Patent Document 1).

The cap metal is formed by supplying the electroless plating solution on the surface of the substrate having the Cu wiring. For example, the substrate may be fixed on a rotary support, and by supplying the electroless plating solution while rotating the rotary support, a uniform liquid flow is generated on the substrate surface, whereby a uniform cap metal can be formed over the entire substrate surface (see, for example, Patent Document 2).

As for the electroless plating, however, it is known that a precipitation ratio of metal is largely affected by reaction conditions such as the composition and the temperature of the plating solution, and the like. Moreover, there has occurred a problem that by-products (residues) due to the plating reaction are generated in the form of slurry and remain on the substrate surface, impeding the uniform flow of the plating solution and making it impossible to replace the deteriorated electroless plating solution with new one. As a result, the reaction conditions on the substrate become locally different, making it difficult to form a cap metal having a uniform film thickness over the entire surface of the substrate. In addition, the substrate surface on which the cap metal is to be formed becomes to have a locally hydrophilic region or a locally hydrophobic region due to a difference in the surface material or sparseness or denseness of wiring. As a result, the electroless plating solution cannot be supplied onto the entire region of the substrate in a uniform manner, resulting in a failure of forming the cap metal having a uniform film thickness over the entire surface of the substrate.

Patent Document 1: Japanese Patent Laid-open Publication No. 2006-111938
Patent Document 2: Japanese Patent Laid-open Publication No. 2001-073157

BRIEF SUMMARY OF THE INVENTION

As stated above, the conventional plating method has a drawback in that the electroless plating solution cannot be uniformly supplied onto the entire surface of the substrate, thus making it difficult to obtain the uniform film thickness over the entire surface of the substrate.

In view of the foregoing, the present disclosure provides a semiconductor manufacturing apparatus and a semiconductor manufacturing method capable of reducing the amount of use of an electroless plating solution and also capable of forming a cap metal having a uniform film thickness over the entire surface of a substrate by suppressing the influence of by-products generated by a plating reaction.

In accordance with one aspect of the present disclosure, there is provided a semiconductor manufacturing apparatus including: a holding mechanism for holding a substrate rotatably; a nozzle for supplying a processing solution for performing a plating process on a processing target surface of the substrate; a substrate rotating mechanism for rotating the substrate held by the holding mechanism in a direction along the processing target surface; a nozzle driving mechanism for moving the nozzle in a direction along the processing target surface at a position facing the processing target surface of the substrate held by the holding mechanism; and a control unit for controlling the supply of the processing solution by the nozzle and the movement of the nozzle by the nozzle driving mechanism. Here, the control unit may perform a first control for supplying the processing solution continuously from the nozzle while moving the nozzle between a central portion and a periphery portion of the substrate; and a second control for supplying the processing solution from the nozzle after locating the nozzle at a preset position.

In accordance with another aspect of the present disclosure, there is provided a semiconductor manufacturing method including: a first cleaning process of cleaning a processing target surface of a substrate; a first plating solution supplying process of continuously supplying a plating solution onto the processing target surface from a nozzle while moving the nozzle between a position facing a central portion of the processing target surface of the substrate washed in the first cleaning process and a position facing a periphery portion thereof; a second plating solution supplying process of intermittently supplying the plating solution onto the processing target surface from the nozzle after stopping the nozzle at a preset position facing the processing target surface of the substrate processed by the first plating solution supplying process; and a second cleaning process of cleaning the processing target surface of the substrate processed by the first and second plating solution supplying processes.

In accordance with the present disclosure, it is possible to achieve the formation of the uniform film thickness over the entire surface of the substrate.

BRIEF DESCRIPTION OF THE DRAWINGS

The disclosure may best be understood by reference to the following description taken in conjunction with the following figures.

DETAILED DESCRIPTION OF THE INVENTION

A general electroless plating process includes a pre-cleaning process, a plating process, a post-cleaning process, a rear surface/end surface cleaning process, and a drying process. Here, the pre-cleaning process is a process for hydrophilicizing a target substrate or performing substrate surface treatments such as elimination of an oxide film/elimination of a rust prevention film/elimination of a metal on an insulating film and the like. The plating process is a process for performing plating by supplying a plating solution onto the substrate. The post-cleaning process is a process for removing residues generated by a plating precipitation reaction. The rear surface/end surface cleaning process is a process for removing residues which are generated during the plating process on the rear surface and the end surface of the substrate. The drying process is a process for drying the substrate. Each of these processing steps is implemented by combining a rotation of the substrate, a supply of a cleaning solution or a plating solution onto the substrate, and so forth.

In the plating process in which a processing solution such as the plating solution is supplied onto the substrate, there may be generated a non-uniformity in the film thickness of a film (plated film) generated by the plating process due to a variation of a processing solution supply, or the like. Especially, in case that the substrate has a large size, the non-uniformity of the film thickness becomes conspicuous. A semiconductor manufacturing apparatus in accordance with an embodiment of the present disclosure is designed to solve the problem of film thickness variation non-uniformity especially in the plating process among each process of the electroless plating process.

Figure 1:
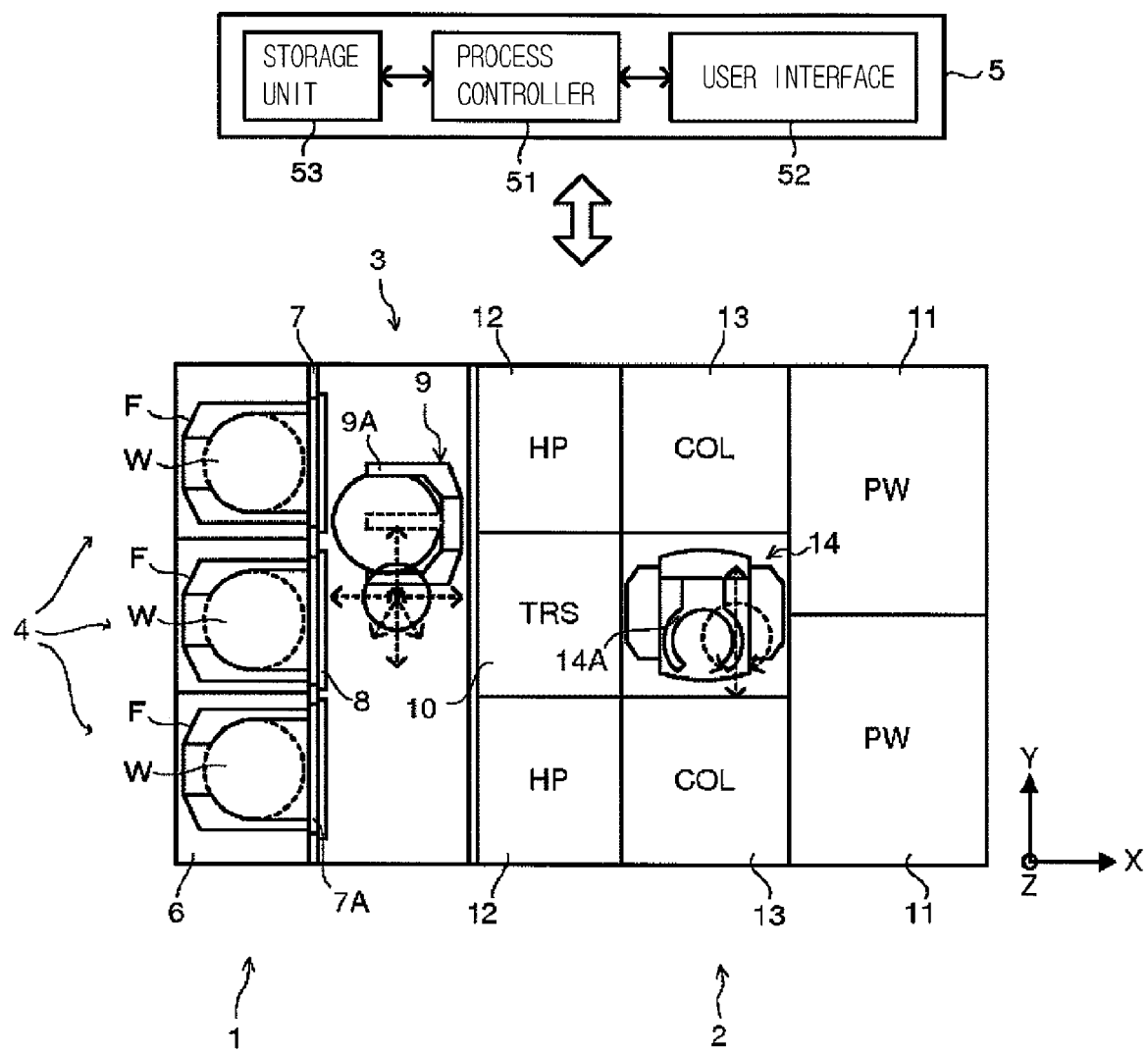
FIG. 1 provides a plane view illustrating a configuration of a semiconductor manufacturing apparatus in accordance with an embodiment of the present disclosure.

Hereinafter, an embodiment of the present disclosure will be described in detail with reference to the accompanying drawings. FIG. 1 is a plane view showing a configuration of a semiconductor manufacturing apparatus in accordance with an embodiment of the present disclosure, and FIGS. 2 and 3 set forth a cross sectional view and a plane view of an electroless plating unit of the semiconductor manufacturing apparatus in accordance with the embodiment of the present disclosure, respectively. FIG. 4 provides a configuration view of a fluid supply device in the semiconductor manufacturing apparatus in accordance with the embodiment of the present disclosure.

As shown in FIG. 1, the semiconductor manufacturing apparatus in accordance with the embodiment of the present disclosure includes a loading/unloading unit 1, a processing unit 2, a conveyance unit 3 and a control unit 5.

The loading/unloading unit 1 is a device for loading and unloading plural substrates W into and out of the semiconductor manufacturing apparatus via FOUPs (Front Opening Unified Pods) F. As shown in FIG. 1, the loading/unloading unit 1 includes three loading/unloading ports 4 arranged in Y direction along the front face (lateral side of X direction of FIG. 1) of the apparatus. Each loading/unloading port 4 has a mounting table 6 for mounting the FOUP F thereon. A partition wall 7 is formed on the rear surface of each gate loading/unloading port 4, and a window 7A corresponding to the FOUP F is formed at the partition wall 7 to be positioned above the mounting table 6. Each window 7A is provided with an opener 8 for opening or closing a lid of the FOUP F. The lid of the FOUP F is opened or closed by the opener 8.

The processing unit 2 is a group of processing units for performing each of the above-described processes on the substrates W sheet by sheet. The processing unit 2 includes a transfer unit TRS 10 for performing a transfer of the substrate W with respect to the conveyance unit 3; electroless plating units PW 11 for performing an electroless plating process and pre- and post-processes therefor on the substrate W; heating units HP 12 for heating the substrate W before and after the plating process; cooling units COL 13 for cooling the substrate W heated by the heating units 12; and a second substrate transfer mechanism 14 disposed in a substantially center portion of the processing unit 2 while being surrounded by the group of these units and serving to transfer the substrate W between the respective units.

The transfer unit 10 includes substrate transfer devices (not shown) vertically arranged in two levels, for example. The upper and lower substrate transfer devices can be used complementarily depending on the purposes of use. For example, the lower substrate transfer device may be used to temporarily mount thereon the substrate W loaded from the loading/unloading port 4, while the upper substrate transfer device may be used to temporarily mount thereon the substrate W to be unloaded back into the loading/unloading port 4.

The two heating units 12 are disposed at locations adjacent to the transfer unit 10 along the Y direction. Each heating unit 12 includes, for example, heating plates vertically arranged in four levels. The two cooling units 13 are disposed at locations adjacent to the second substrate transfer mechanism 14 in the Y direction. Each cooling unit 13 includes, for example, cooling plates vertically arranged in four levels. The two electroless plating units 11 are arranged in the Y direction along the cooling units 13 and the second substrate transfer mechanism 14 located adjacent to them.

The second substrate transfer mechanism 14 includes, for example, two transfer arms 14A vertically arranged in two levels. Each of the upper and lower transfer arms 14A is configured to be movable up and down and rotatable along a horizontal direction. With this configuration, the second substrate transfer mechanism 14 transfers the substrates W between the transfer unit 10, the electroless plating units 11, the heating units 12 and the cooling unit 13 by the transfer arms 14A.

The conveyance unit 3 is a transfer mechanism located between the loading/unloading unit 1 and the processing unit 2 and serving to transfer the substrates W sheet by sheet. A first substrate transfer mechanism 9 for transferring the substrates W sheet by sheet is disposed in the conveyance unit 3. The substrate transfer mechanism 9 includes, for example, two transfer arms 9A vertically arranged in two levels and movable along a Y direction, and it performs a transfer of the substrates W between the loading/unloading unit 1 and the processing unit 2. Likewise, each transfer arm 9A is configured to be movable up and down and rotatable along a horizontal direction. With this configuration, the first substrate transfer mechanism 9 transfers the substrates W between the FOUPs F and the processing unit 2 by the transfer arms 9A.

The control unit 5 includes a process controller 51 having a microprocessor; a user interface 52 connected with the process controller 51; and a storage unit 53 for storing therein computer programs for regulating the operation of the semiconductor manufacturing apparatus in accordance with the present embodiment, and controls the processing unit 2, the conveyance unit 3, and so forth. The control unit 5 is on-line connected with a non-illustrated host computer and controls the semiconductor manufacturing apparatus based on instructions from the host computer. The user interface 52 is an interface including, for example, a key board, a display, and the like, and the storage unit 53 includes, for example, a CD-ROM, a hard disk, a nonvolatile memory or the like.

Now, the operation of the semiconductor manufacturing apparatus in accordance with the present embodiment will be explained. A substrate W to be processed is previously accommodated in a FOUP F. First, the first substrate transfer mechanism 9 takes the substrate W out of the FOUP F through the window 7A and transfers it to the transfer unit 10. Once the substrate W is transferred to the transfer unit 10, the second substrate transfer mechanism 14 transfers the substrate W from the transfer unit 10 to the hot plate of the heating unit 12 by using the transfer arm 14A.

The heating unit 12 heats (pre-bakes) the substrate W up to a preset temperature, to thereby eliminate organic materials attached on the surface of the substrate W. After the heating process, the second substrate transfer mechanism 14 delivers the substrate W from the heating unit 12 into the cooling unit 13. The cooling unit 13 cools the substrate W.

After the completion of the cooling process, the second substrate transfer mechanism 14 transfers the substrate W into the electroless plating unit 11 by using the transfer arm 14A. The electroless plating unit 11 performs an electroless plating process on a wiring formed on the surface of the substrate W or the like.

After the completion of the electroless plating process, the second substrate transfer mechanism 14 transfers the substrate W from the electroless plating unit 11 to the hot plate of the heating unit 12. The heating unit 12 performs a post-baking process on the substrate W to remove organic materials contained in a plated film (cap metal) formed by the electroless plating as well as to enhance adhesiveness between the plated film and the wiring or the like. After the completion of the post-baking process, the second substrate transfer mechanism 14 transfers the substrate W from the heating unit 12 into the cooling unit 13. The cooling unit 13 cools the substrate W again.

After the completion of the cooling process, the second substrate transfer mechanism 14 transfers the substrate W to the transfer unit 10. Then, the first substrate transfer mechanism 9 returns the substrate W mounted on the transfer unit 10 back into a preset position in the FOUP F by using the transfer arm 9A.

Figure 2:
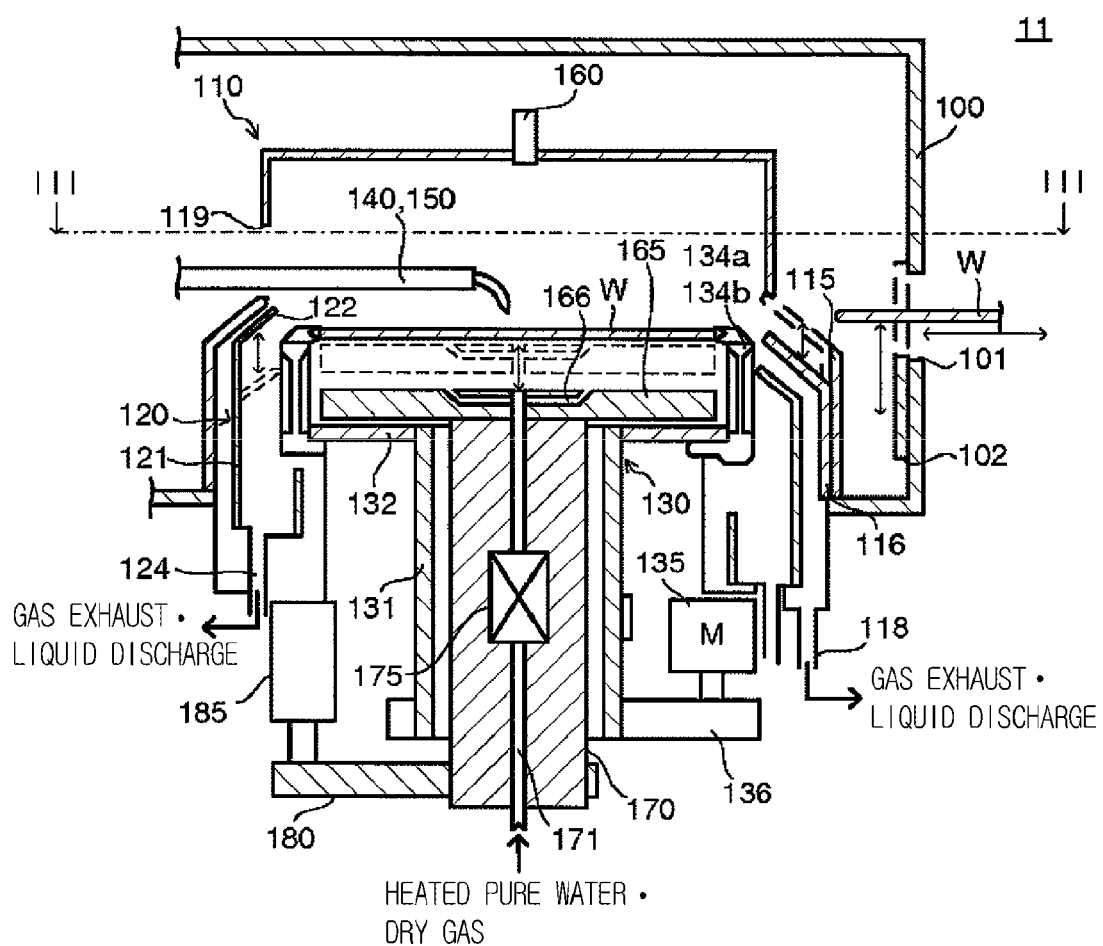
FIG. 2 sets forth a cross sectional view of an electroless plating unit of the semiconductor manufacturing apparatus in accordance with the embodiment of the present disclosure.

Subsequently, the electroless plating unit 11 of the semiconductor manufacturing apparatus in accordance with the present embodiment will be explained in detail in conjunction with FIGS. 2 to 4. As shown in FIG. 2, the electroless plating unit 11 (hereinafter, simply referred to as a "plating unit 11") includes an outer chamber 110, an inner chamber 120, a spin chuck 130, a first and a second fluid supply unit 140 and 150, a gas supply unit 160, a back plate 165.

The outer chamber 110 is a processing vessel installed inside a housing 100, for performing the plating process therein. The outer chamber 110 is formed in a cylinder shape to surround an accommodation position of the substrate W and is fixed on the bottom surface of the housing 100. Installed at a lateral side of the outer chamber 110 is a window 115 through which the substrate W is loaded and unloaded, and the window 115 is opened or closed by a shutter mechanism 116. Further, an openable/closable shutter mechanism 119 for operating the first and second fluid supply units 140 and 150 is installed at a lateral side of the outer chamber 110 facing the window 115. Moreover, a gas supply unit 160 is installed on the top surface of the outer chamber 110, and a drain unit 118 for discharging a gas, the processing solution or the like is provided at a lower portion of the outer chamber 110.

The inner chamber 120 is a vessel for receiving therein the processing solution dispersed from the substrate W, and it is installed inside the outer chamber 110. The inner chamber 120 is formed in a cylinder shape between the outer chamber 110 and the accommodation position of the substrate W, and it includes a drain unit 124 for the discharge of a gas or a liquid. The inner chamber 120 is configured to be movable up and down inside the outer chamber 110 by a non-illustrating elevating mechanism such as a gas cylinder or the like. Specifically, the end of its upper end portion 122 is moved up and down between a position (processing position) slightly higher than the accommodation position of the substrate W and a position (retreat position) lower than the processing position. Here, the processing position is a position where the electroless plating process is performed on the substrate W, and the retreat position is a position where the loading/unloading of the substrate W, cleaning of the substrate W or the like is performed.

The spin chuck 130 is a substrate fixing mechanism for holding the substrate W thereon in a substantially horizontal manner. The spin chuck 130 includes a rotary cylinder body 131; an annular rotary plate 132 horizontally extended from the upper end of the rotary cylinder body 131; supporting pins 134a installed at an outer peripheral end of the rotary plate 132 at a same distance, for supporting the outer periphery portion of the substrate W; and pressing pins 134b for pressing the outer peripheral surface of the substrate W. As illustrated in FIG. 3, the supporting pins 134a and the pressing pins 134b are arranged, for example, in sets of three along the circumferential direction. The supporting pins 134a are fixtures which support and fix the substrate W at the preset position, and the pressing pins 134b are pressing devices which press the substrate W downward. A motor 135 is installed at a lateral side of the rotary cylinder body 131, and an endless belt 136 is wound between a driving shaft of the motor 135 and the rotary cylinder body 131. That is, the rotary cylinder body 131 is rotated by the motor 135. The supporting pins 134a and the pressing pins 134b are rotated in the horizontal direction (planar direction of the substrate W), whereby the substrate W supported by them is also rotated.

The gas supply unit 160 dries the substrate W by supplying a nitrogen gas or clean air into the outer chamber 110. The supplied nitrogen gas or clean air is re-collected via the drain unit 118 or 124 installed at the lower end of the outer chamber 110.

The back plate 165 is installed between the holding position of the substrate W by the spin chuck 130 and the rotary plate 132, facing the bottom surface of the substrate W held on the spin chuck 130. The back plate 165 has a heater embedded therein and is connected with a shaft 170 which penetrates the center of axis of the rotary cylinder body 131. Provided in the back plate 165 is a flow path 166 which is opened at plural positions on the surface thereof, and a fluid supply path 171 is formed to penetrate through the flow path 166 and the center of axis of the shaft 170. A heat exchanger 175 is disposed in the fluid supply path 171. The heat exchanger 175 regulates a processing fluid such as pure water or a dry gas at a preset temperature. That is, the back plate 165 functions to supply the humidity-controlled processing fluid toward the bottom surface of the substrate W. An elevating mechanism 185 such as an air cylinder or the like is connected to a lower end portion of the shaft 170 via a coupling member 180. The back plate 165 is moved up and down between the substrate W held on the spin chuck 130 and the rotary plate 132 by the elevating mechanism 185 and the shaft 170.

Figure 3:
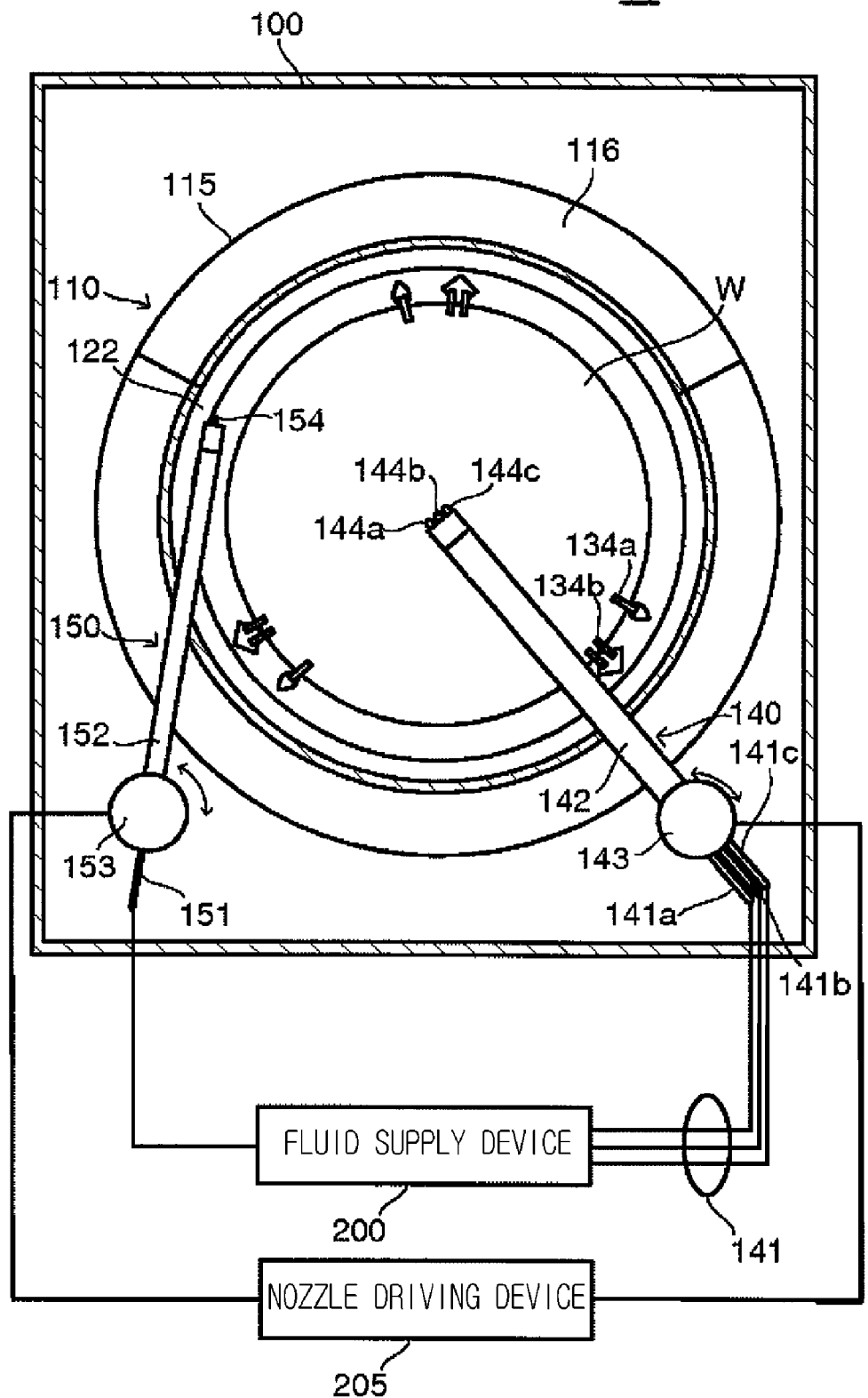
FIG. 3 presents a plane view of the electroless plating unit of the semiconductor manufacturing apparatus in accordance with the embodiment of the present disclosure.
Figure 4:
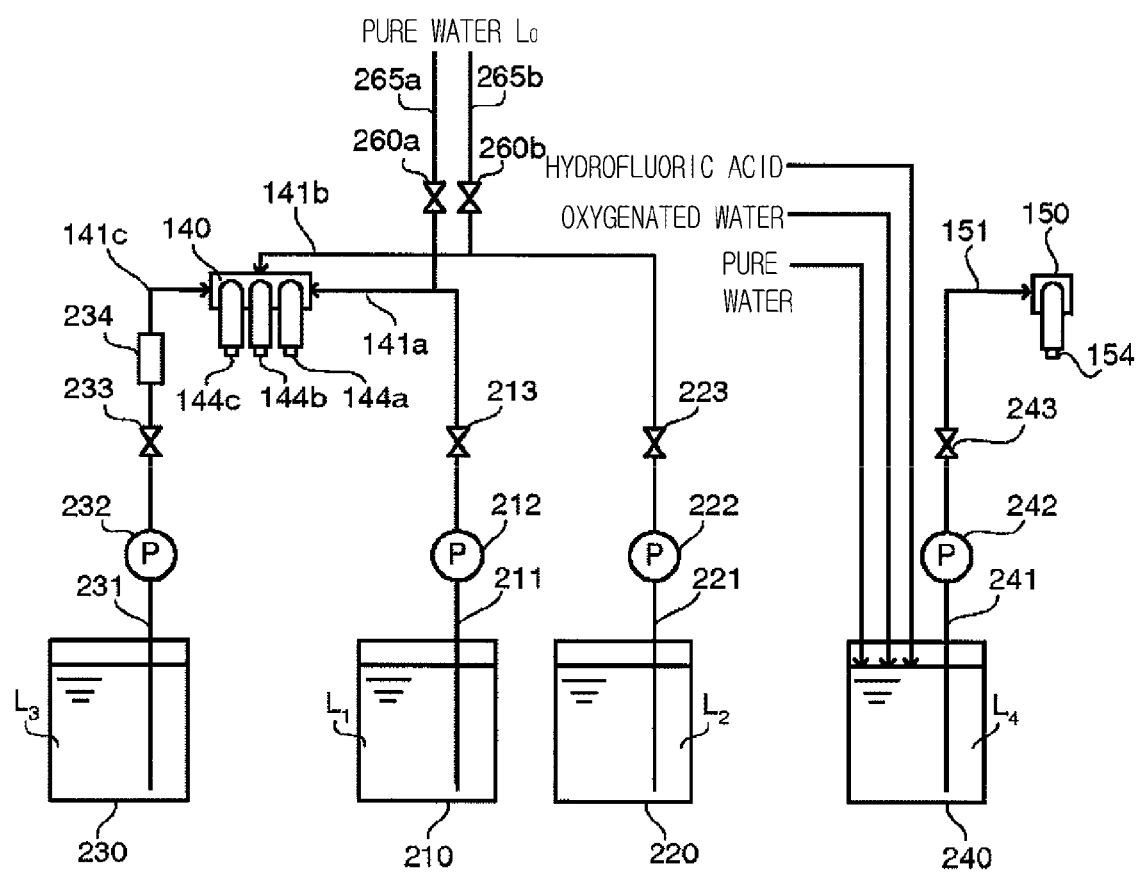
FIG. 4 depicts a configuration view of a fluid supply device of the semiconductor manufacturing apparatus in accordance with the embodiment of the present disclosure.

As shown in FIG. 3, the first and second fluid supply units 140 and 150 supply the processing solution onto the top surface of the substrate W held by the spin chuck 130. The first and second fluid supply units 140 and 150 have a fluid supply device 200 for storing therein a fluid such as the processing solution; and a nozzle driving device 205 for driving a supply nozzle. Each of the first and second fluid supply units 140 and 150 is installed inside the housing 100 so as to allow the outer chamber 110 to be interposed therebetween.

The first fluid supply unit 140 includes a first pipe 141 connected with the fluid supply device 200; a first arm 142 supporting the first pipe 141; a first rotation driving mechanism 143 for rotating the first arm 142 with respect to a basal end of the first arm 142 by using a stepping motor or the like disposed at that basal end of the first arm 142. The first fluid supply unit 140 has a function of supplying the processing fluid such as the electroless plating processing solution or the like. The first pipe 141 has pipes 141a to 141c for supplying three kinds of fluids individually, and these pipes 141a to 141c are respectively connected with nozzles 144a to 144c at the leading end portion of the first arm 142.

Likewise, the second fluid supply unit 150 includes a second pipe 151 connected with the fluid supply device 200; a second arm 152 supporting the second pipe 151; and a second rotation driving mechanism 153 disposed at the basal end of the second arm 152, for rotating the second arm 152. The second pipe 151 is connected with a nozzle 154 at the leading end portion of the second arm 152. The second fluid supply unit 150 has a function of supplying a processing fluid for processing the outer periphery portion (periphery portion) of the substrate W. The first and second arms 142 and 152 are rotated above the substrate W held on the spin chuck 130 via the shutter mechanism 119 installed in the outer chamber 110.

Here, the fluid supply device 200 will be described in detail with reference to FIG. 4. The fluid supply device 200 supplies the processing fluid to the first and second fluid supply units 140 and 150. As illustrated in FIG. 4, the fluid supply device 200 includes a first tank 210, a second tank 220, a third tank 230 and a fourth tank 240.

The first tank 210 stores therein a pre-cleaning processing solution $L_1$ used for the pre-treatment of the electroless plating process of the substrate W. The second tank 220 stores therein a post-cleaning processing solution $L_2$ used for the post-treatment of the electroless plating process of the substrate W. The first and second tanks 210 and 220 include temperature control mechanisms (not shown) for controlling the temperatures of the processing solutions $L_1$ and $L_2$ at preset temperature levels, and are connected with a pipe 211 coupled with the first pipe 141a and a pipe 221 coupled with the first pipe 141b, respectively. The pipes 211 and 221 are provided with pumps 212 and 222 and valves 213 and 223, respectively. The processing solutions $L_1$ and $L_2$ whose temperatures are controlled at the preset temperature levels are supplied into the first pipes 141a and 141b, respectively. That is, by operating each of the pumps 212 and 222 and the valves 213 and 223, the processing solutions $L_1$ and $L_2$ are transported to the nozzles 144a and 144b via the first pipes 141a and 141b, respectively.

The third tank 230 stores therein a plating solution $L_3$ for use in processing the substrate W. The third tank 230 is connected with a pipe 231 coupled to the first pipe 141c. Installed on the pipe 231 are a pump 232, a valve 233 and a heater (e.g., a heat exchanger 234) for heating the plating solution $L_3$. That is, the temperature of the plating solution $L_3$ is controlled by the heater 234, and the plating solution $L_3$ is transported to the nozzle 144c via the first pipe 141c by the cooperation of the pump 232 and the valve 233.

The fourth tank 240 stores therein an outer periphery processing solution $L_4$ for use in processing the outer periphery portion of the substrate W. The fourth tank 240 is connected with a pipe 241 coupled to the second pipe 151. A pump 242 and a valve 243 are installed on the pipe 241. That is, the outer periphery processing solution $L_4$ is sent out into the nozzle 154 via the second pipe 151 by the cooperation of the pump 242 and the valve 243.

Further, a pipe for supplying, e.g., hydrofluoric acid, a pipe for supplying oxygenated water and a pipe for supplying pure water $L_0$ are also connected with the fourth tank 240. That is, the fourth tank 240 also functions to mix these solutions at a preset mixture ratio.

Further, pipes 265a and 265b for supplying pure water $L_0$, are connected with the first pipe 141a and 141b, respectively. A valve 260a is installed on the pipe 265a, and a valve 260b is installed on the pipe 265b. That is, the nozzles 144a and 144b are also capable of supplying the pure water $L_0$.

Figure 5:
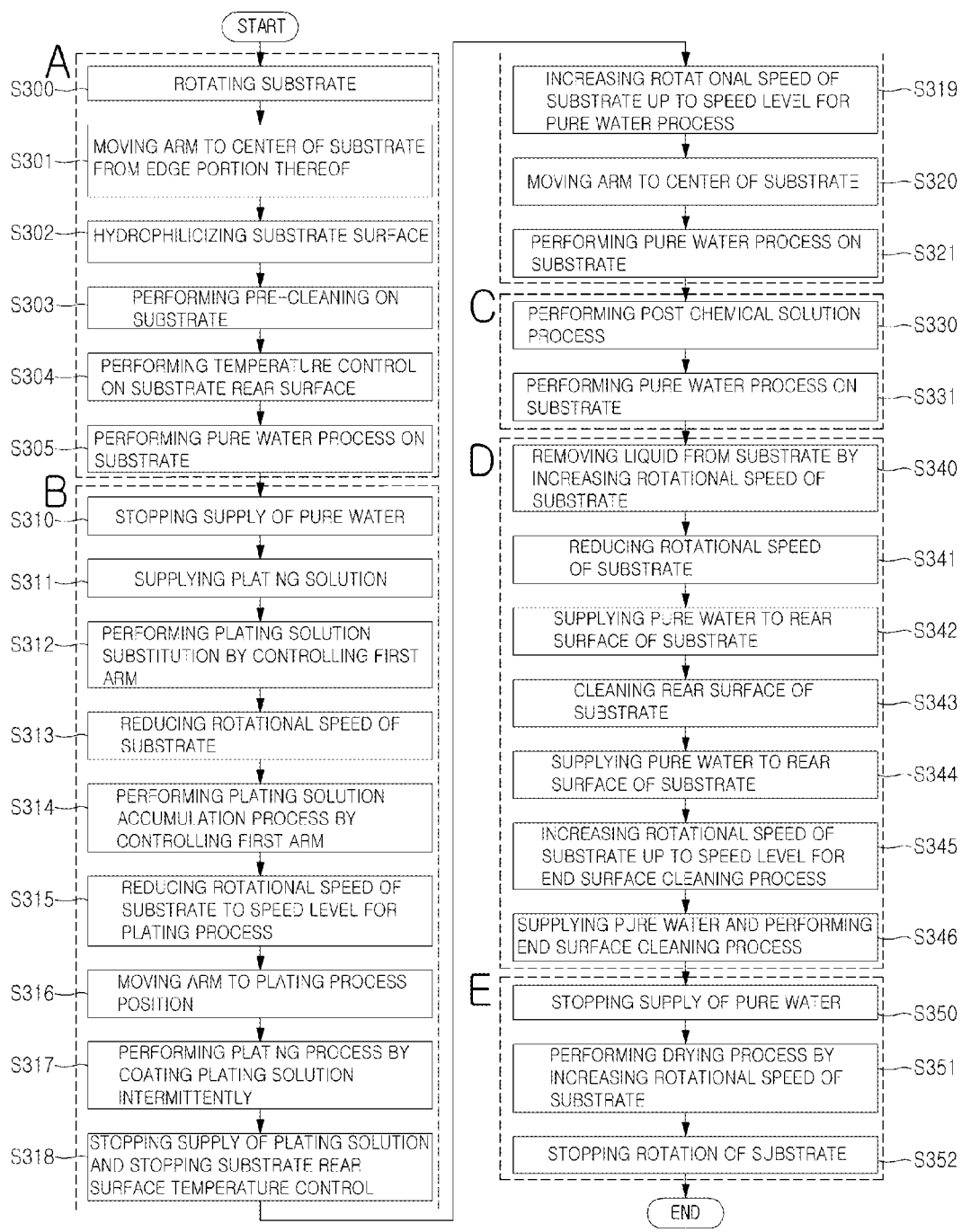
FIG. 5 provides a flowchart to describe an operation of the plating unit in accordance with the embodiment of the present disclosure.
Figure 6:
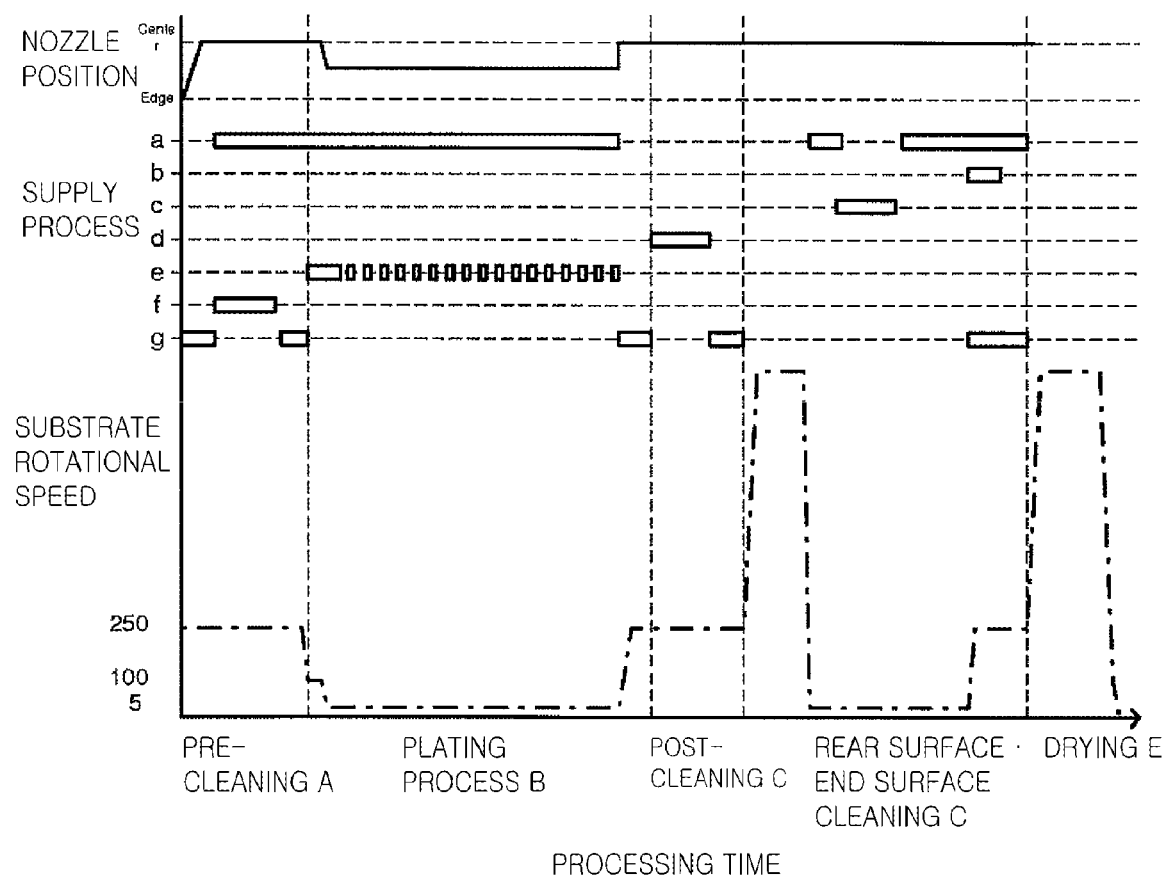
FIG. 6 is a chart illustrating a process sequence of the operation of the plating unit in accordance with the embodiment of the present disclosure.
Figure 7:
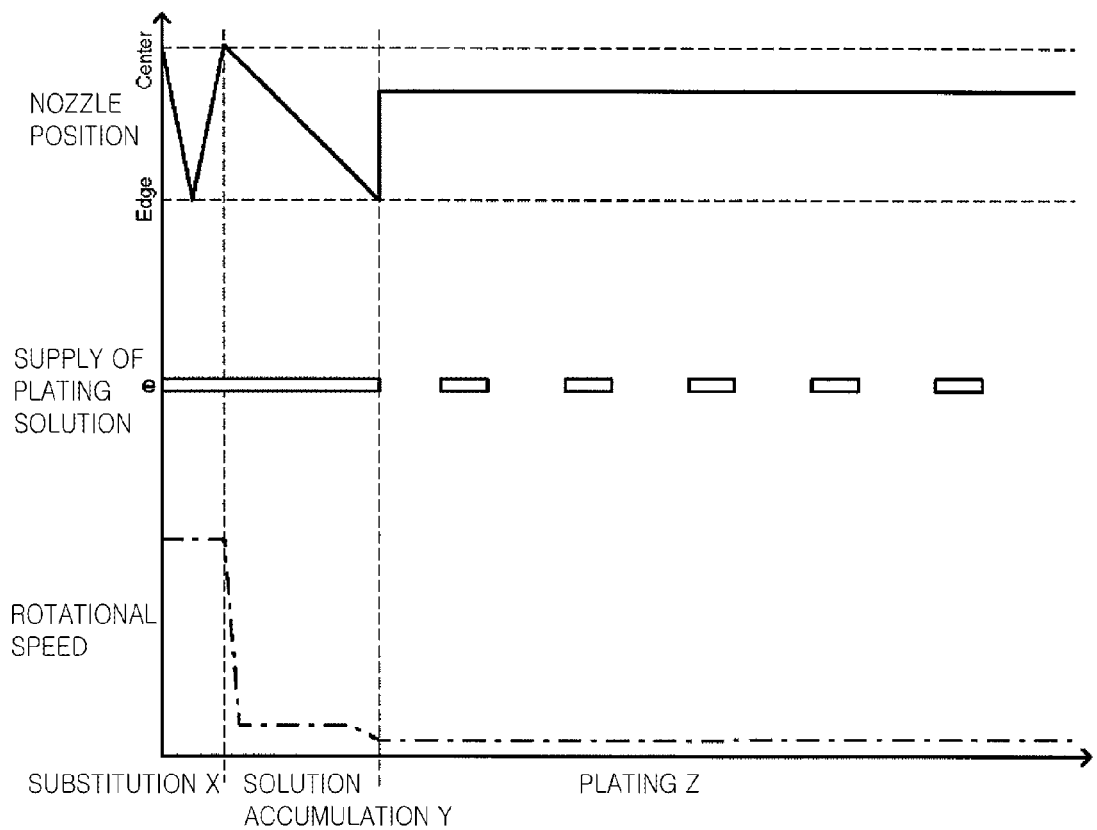
FIG. 7 sets forth a chart illustrating a process sequence of a plating process performed by the plating unit in accordance with the embodiment of the present disclosure.

Now, the operation of the electroless plating unit 11 in accordance with the present embodiment will be described with reference to FIGS. 1 to 7. FIG. 5 provides a flowchart to describe the operation of the electroless plating unit 11 in accordance with the present embodiment. FIG. 6 illustrates a process sequence of the electroless plating unit 11 in accordance with the present embodiment, and FIG. 7 illustrates a process sequence of a plating solution process performed by the electroless plating unit 11 in accordance with the present embodiment. As shown in FIG. 5, the plating unit 11 in accordance with the present embodiment performs five processing steps including a pre-cleaning process ("A" in the figure), a plating process ("B" in the figure), a post-cleaning process ("C" in the figure), a rear surface/end surface cleaning process ("D" in the figure) and a drying process ("E" in the figure). Further, as shown in FIG. 6, the plating unit 11 performs seven supply processes of processing liquids including a rear surface pure water supply a for supplying heated pure water to the rear surface of the substrate; a end surface cleaning b for cleaning an end surface of the substrate; a rear surface cleaning c for cleaning the rear surface of the substrate; a post-cleaning d for cleaning the substrate after a plating process; the plating process e; a pre-cleaning f for cleaning the substrate prior to the plating process; and a pure water supply g for controlling the hydrophilicity of the substrate W.

The first substrate transfer mechanism 9 takes substrate W sheet by sheet from the FOUP F of the loading/unloading unit 1 and loads each substrate W into the transfer unit 10 of the processing unit 2. Once the substrate W is loaded, the second substrate transfer mechanism 14 transfers the substrate W into the heating unit 12 and the cooling unit 13 in which the substrate W processed by a heat treatment therein. Upon the completion of the heat treatment, the second substrate transfer mechanism 14 transfers the substrate W into the electroless plating unit 11.

The transfer arm 14A of the second substrate transfer mechanism 14 transfers the substrate W onto the spin chuck 130 through the window 115. The spin chuck 130 holds the substrate W thereon by means of the supporting pins 134a and the pressing pins 134b. If the transfer of the substrate W is completed, the shutter mechanism 116 is closed, and the outer chamber 110 comes into a process standby state.

First, the process controller 51 carries out the pre-cleaning process A. The pre-cleaning process A includes a hydrophilicizing process, a pre-cleaning process, and a pure water process.

The process controller 51 rotates the substrate W held on the spin chuck 130 by driving the motor 135 (step S300). The spin chuck 130 is rotated at a rotational speed of, e.g., about 100 to 500 rpm, desirably, about 250 rpm.

If the spin chuck 130 is rotated, the process controller 51 instructs the nozzle driving device 205 to drive the first fluid supply unit 140. The nozzle driving device 205 moves the first arm 142 to a preset position on the substrate W (e.g., a position in which the nozzle 144a is located at the center of the substrate W) by operating the first rotation driving mechanism 143 (S301). Further, the nozzle driving device 205 also moves the second arm 152 to a periphery portion of the substrate W by operating the second rotary driving mechanism 153. When the two arms reach their preset positions, the process controller 51 instructs the fluid supply device 200 to perform the hydrophilicizing process. Then, the fluid supply device 200 supplies a preset amount of pure water $L_0$ into the nozzle 144a by opening the valve 260a (supply process g in FIG. 6). At this time, the nozzle 144a is located above the substrate W by, e.g., about 0.1 to 20 mm (S302). Likewise, the fluid supply unit 200 supplies the processing liquid $L_4$ into the nozzle 154 by opening the valve 243. In this process, as the processing liquid $L_4$, one capable of obtaining a hydrophilicizing effect different from that of the pure water $L_0$ is employed.

This hydrophilicizing process prevents the pre-cleaning solution to be supplied in the subsequent pre-cleaning process from splashing off the surface of the substrate W and also suppresses the plating solution from being dropped off the surface of the substrate W. The supply rate of pure water $L_0$ is controlled depending on the hydrophobic property of the surface of the substrate W, and it is effective to set the supply rate to about 0.5 to 2.0 L/min. Especially, in case of an insulating film having high hydrophobic property (e.g., an organic low-k film such as SiOCH), it is more desirable to set the supply rate of the pure water $L_0$ to be about 1.5 L/min. Further, it is effective to set the rotational speed of the substrate W to, e.g., about 100 to 500 rpm because the hydrophilicization cannot be properly achieved in case the rotational speed of the substrate W is higher than or equal to, e.g., about 1000 rpm. The processing time for the hydrophilicizing process is appropriately set depending on the kind of the substrate W, and it may be set to be, e.g., about 5 to 30 seconds. The first and second fluid supply units 140 and 150 cooperatively control the hydrophilicity around the center portion and the periphery portion of the substrate W, respectively, thereby allowing a uniform plating process to be performed on the entire region of the substrate W. The positions of the nozzles 144a and 154 can be changed depending on plating process conditions or the like, and the level of hydrophilicity of each of the center portion and the periphery portion of the substrate W can also be changed arbitrarily.

Figure 8A:
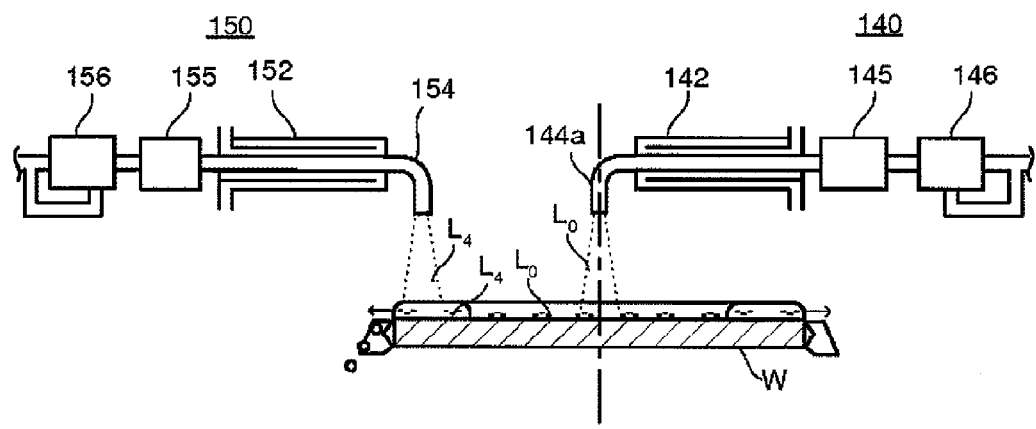
FIG. 8A is a schematic side view of a first fluid supply unit.
Figure 8B:
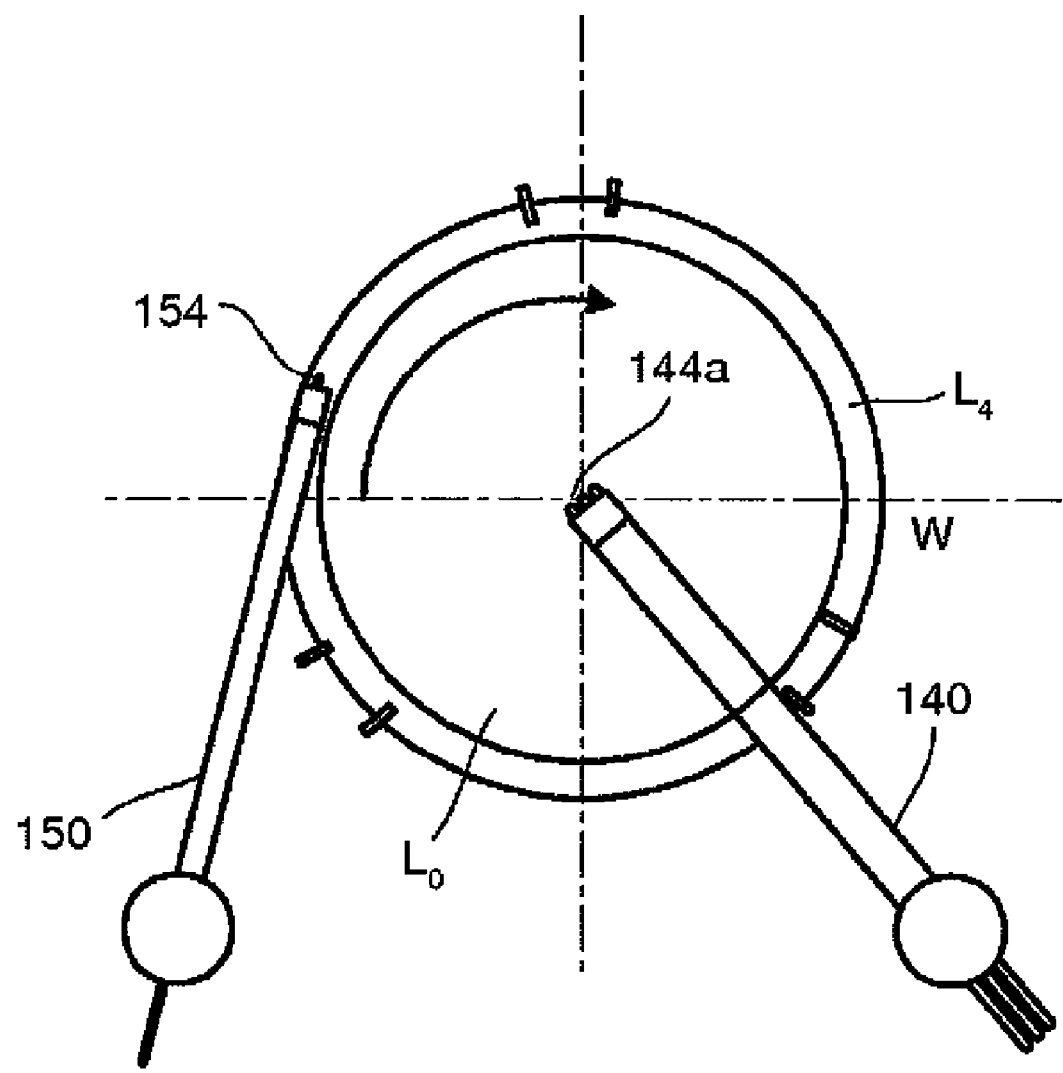
FIG. 8B illustrates a state of performing a hydrophilicizing process by supplying pure water from the first fluid supply unit.

FIGS. 8A and 8B illustrate the state of such hydrophilicizing process. FIG. 8A is a schematic side view of the first and second fluid supply units 140 and 150, and FIG. 8B illustrates the state of performing the hydrophilicizing process by supplying the pure water $L_0$ from the first fluid supply unit 140 and the processing solution $L_4$ from the second fluid supply unit 150. As shown in FIGS. 8A and 8B, the first arm 142 is disposed at an almost center position of the substrate W, while the second arm 152 is disposed at a periphery position of the substrate W. The pure water $L_0$ and the processing solution $L_4$ are supplied onto the surface of the substrate W from the nozzles 144a and 154, respectively. Here, as illustrated in FIG. 8A, the first and second fluid supply units 140 and 150 may include temperature controllers 145 and 155 for controlling the temperature of the pure water $L_0$ and the processing solution $L_4$ and pump mechanisms 146 and 156 for transporting the pure water $L_0$ and the processing solution $L_4$ into the nozzle 144a and 154, respectively. The pump mechanisms 146 and 156 have a function of sucking the pure water $L_0$ and processing solution $L_4$ from the nozzles 144a and 154 as well as a function of transporting it into the nozzles 144a and 154. That is, the pump mechanisms 146 and 156 function to suck residual pure water $L_0$ and processing solution $L_4$ after a pure water $L_0$ or the like are supplied, thus preventing the pure water $L_0$ and the processing solution $L_4$ from dropping from the leading ends of the nozzles 144a and 154. With this configuration, the non-uniformity problem of the fluids on the substrate W can be prevented.

Subsequently, the process controller 51 instructs the fluid supply device 200 to perform the pre-cleaning process (supply process f in FIG. 6) and the heated pure water supply to the rear surface (supply process a in FIG. 6). The fluid supply device 200 stops the supply of the pure water $L_0$ by closing the valve 260a and stops the supply of the processing solution $L_4$ by closing the valve 243, and supplies the pre-cleaning processing solution $L_1$ into the nozzle 144a by driving the pump 212 and the valve 213 (S303). Here, since the nozzle 144a is moved to the almost central position of the substrate W, the nozzle 144a becomes to supply the pre-cleaning solution $L_1$ toward the almost central portion of the substrate W. Since organic acid or the like is used as the pre-cleaning processing solution, it can eliminate copper oxide from copper wiring without causing galvanic corrosion, thereby increasing nucleation density in the plating process. The supply rate of the pre-cleaning processing solution $L_1$ is desirably set to be about 0.5 to 2.0 L/min in consideration of the necessity of substituting the pure water $L_0$ on the surface of the substrate W with the pre-cleaning processing solution $L_1$. If the rotational speed of the substrate W is too slow, metal species that need to be removed cannot be eliminated from the surface of the substrate W. Meanwhile, if the rotational speed of the substrate W is too fast, there are generated several dry spots on the surface of the substrate W, which may cause oxidation of the surface of the copper wiring. From these considerations, it is desirable to set the rotational speed to, e.g., about 100 to 500 rpm. Furthermore, if the processing time for this pre-cleaning process is too long, the copper region would be excessively dissolved, so that it is desirable to set the processing time to, e.g., about 10 to 60 seconds.

Thereafter, the fluid supply device 200 supplies the pure water to the fluid supply path 171. The heat exchanger 175 controls the temperature of the pure water sent into the fluid supply path 171 and supplies the temperature-controlled pure water to the bottom surface of the substrate W via the flow path 166 provided in the back plate 165, whereby the temperature of the substrate W is maintained at a temperature adequate for the plating process. Further, almost the same effect as described can be obtained even if starting the supply of the pure water into the fluid supply path 171 simultaneously with the above-mentioned step S300.

Upon the completion of the pre-cleaning process, the process controller 51 instructs the fluid supply device 200 to perform the pure water process (supply process g in FIG. 6) (S305). The fluid supply device 200 stops the supply of the pre-cleaning processing solution $L_1$ by operating the pump 212 and the valve 213, and sends a certain amount of pure water $L_0$ into the nozzle 144a by opening the valve 260a. Then, by the supply of the pure water $L_0$ from the nozzle 144a, the pre-cleaning processing solution is substituted with the pure water. Through this pure water process, a process error due to the mixing of the acid pre-cleaning processing solution $L_1$ with the alkaline plating processing solution can be prevented. Desirably, this pure water process is performed consecutively in order to suppress the oxidation of the copper wiring on the substrate W by preventing the substrate W from getting dried. For the pure water process, it is desirable that the supply amount of the pure water ranges from about 0.5 to 2.0 L/min; the rotational speed of the substrate W is about 100 to 500 rpm; and the processing time is about 10 to 60 seconds.

After the pre-cleaning process A, the process controller 51 performs the plating process B. The plating process B includes a plating solution substitution process, a plating solution accumulation process, a plating solution process, and a pure water process. In FIG. 7, the process marked by X is the plating solution substitution process; the process marked by Y is the plating solution accumulation process; and the process marked by Z is the plating solution process.

The process controller 51 instructs the fluid supply device 200 and the nozzle driving device 205 to perform the plating solution substitution process (supply process e in FIG. 6). The fluid supply device 200 stops the supply of the pure water $L_0$ by closing the valve 260a (S310), and supplies the plating solution $L_3$ into the nozzle 144c by operating the pump 232 and the valve 233 (S311). Meanwhile, the nozzle driving device 205 operates the first rotation driving mechanism 143 to thereby rotate the first arm 142 such that that the nozzle 144c is moved (scanned) from the central portion of the substrate W to the periphery portion thereof and then back to the central portion again (S312). That is, in the plating solution substitution process X, the plating solution supply nozzle is moved from the central portion of the substrate W to the periphery portion thereof and then back to the central portion, and the substrate W is rotated at a relatively high rotational speed, as shown in FIG. 7. By this operation, the plating solution $L_3$ is diffused onto the substrate W, so that it becomes possible to rapidly substitute the pure water on the surface of the substrate W with the plating solution. Here, it is desirable that the rotational speed of the substrate W ranges from about 100 to 300 rpm, and the rotational speed of the first arm 142 is set so as to move the nozzle 144C at a speed of about 150 mm/sec. At this time, it can be set up that the nozzle 144c is moved from the central portion to the periphery portion and from the periphery portion back to the central portion at different speeds. Through this process, the stay of the pure water on the substrate W can be prevented. Especially, by performing the rotation of the first arm 142 (movement of the nozzle 144c) and the supply of the plating solution $L_3$ at the same time, temperature decrease of the plating solution $L_3$ on the substrate W can be prevented, thus improving temperature rise efficiency of the entire substrate W.

Upon the completion of the plating solution substitution process, the process controller 51 reduces the rotational speed of the substrate W held on the spin chuck 130 (S313), and instructs the fluid supply device 200 and the nozzle driving device 205 to perform the plating solution accumulation process. At this time, it is desirable that the rotational speed of the substrate W is set to be about 50 to 100 rpm. The fluid supply device 200 keeps on supplying the plating solution $L_3$, and the nozzle driving device 205 operates the first rotation driving mechanism 143, whereby the nozzle 144c is slowly moved from the central portion of the substrate W toward the periphery portion thereof (S314). The surface of the substrate W treated by the plating solution substitution process is covered with a sufficient amount of plating solution $L_3$. That is, as shown in FIG. 7, in the plating solution accumulation process, the plating solution is consecutively supplied while the nozzle is being moved from the center toward the periphery portion. Accordingly, uniform plating process can be implemented over the entire region of the substrate W.

Further, when the nozzle 144c approaches close to the vicinity of the periphery portion of the substrate W, the process controller 51 further reduces the rotational speed of the substrate W (S315). In this stage (e.g., for about 1 to 2 seconds), it is desirable that the rotational speed of the substrate W is set to be the same level as that of a typical plating process, i.e., about 5 to 20 rpm to perform the plating process stably.

Figure 9:
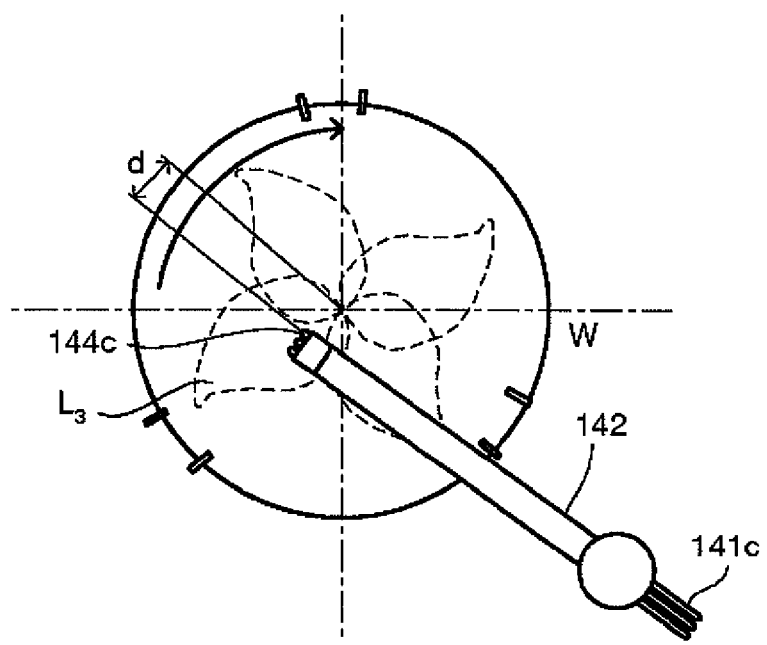
FIG. 9 is a schematic top view of the first fluid supply unit.

Subsequently, the process controller 51 instructs the fluid supply device 200 and the nozzle driving device 205 to perform the plating process. The nozzle driving device 205 operates the first rotation driving mechanism 143 to thereby rotate the first arm 142 so as to locate the nozzle 144c at an almost midway position between the central portion and the periphery portion of the substrate W (S316). Desirably, the position of the nozzle 144c is distanced apart from the center of the substrate W in a radial direction by, for example, about 30 to 100 mm, and more desirably, about 30 to 70 mm. FIG. 9 illustrates such state of the nozzle 144c. FIG. 9 is a schematic top view of the first fluid supply unit 140. As shown in FIG. 9, the first arm 142 is moved such that the nozzle 144c is located at a midway position (a position distanced apart from the center of the substrate W by a distance d) between the central portion and the periphery portion of the substrate W, and the plating solution $L_3$ is supplied onto the substrate W intermittently. With this configuration and operation, the plating solution can be diffused onto the entire surface of the substrate W uniformly.

Then, the fluid supply device 200 supplies the plating solution $L_3$ into the nozzle 144c discontinuously or intermittently by operating the pump 232 and the valve 233 (S317). That is, as illustrated in FIG. 7, the nozzle is located at a preset position and the plating solution is supplied discontinuously or intermittently. Since the substrate W is being rotated, the plating solution $L_3$ can be widely diffused onto the entire region of the substrate W even if it is supplied discontinuously (intermittently). Further, the processes of the steps S311 to S317 may be performed repetitively. After a lapse of a predetermined time period after the supply of the plating solution $L_3$ is begun, the fluid supply device 200 stops the supply of the plating solution $L_3$, and the process controller 51 stops the supply of the heated pure water to the rear surface of the substrate W (S318). The supply amount of the plating solution is sufficient if the plating solution supplied on the surface of the substrate is prevented from getting dried, and it may be, for example, about 100 to 400 mL/min. Further, the rotational speed of the substrate W is desirably set to be in the range of about 1 to 25 rpm to prevent non-uniform heating or dryness due to a centrifugal force. The time period for supplying the plating solution $L_3$ can be properly determined depending on the thickness of the plated film to be formed. As for intermittence degree of the supply of the plating solution (i.e., an on/off ratio of the supply), the period (on-period) during which the plating solution is supplied may be set to be longer or the period (off-period) during which the supply is stopped may be set to be longer.

Further, the process controller 51 instructs the fluid supply device 200 and the nozzle driving device 205 to perform the pure water process (supply process g in FIG. 6). The process controller 51 increases the rotational speed of the substrate W held on the spin chuck 130 (S319), and the nozzle driving device 205 operates the first rotation driving mechanism 143 to thereby rotate the first arm 142 so as to locate the nozzle 144c at the central portion of the substrate W (S320). Thereafter, the fluid supply device 200 supplies the pure water $L_0$ by opening the valve 260a (S321). In this way, the plating solution left on the surface of the substrate W is eliminated so that the plating solution can be prevented from being mixed with a post-processing solution. This process needs to be performed in a state that the substrate W is not dry so as to prevent the oxidation of the copper wiring. Desirably, the supply amount of the pure water is, e.g., about 0.5 to 2.0 L/min and the rotational speed of the substrate W is, e.g., about 100 to 500 rpm. Further, the processing time may be set so as to allow the plating solution from being removed from the surface of the substrate W, and it may be set, for example, about 10 to 60 seconds.

Figure 10A:
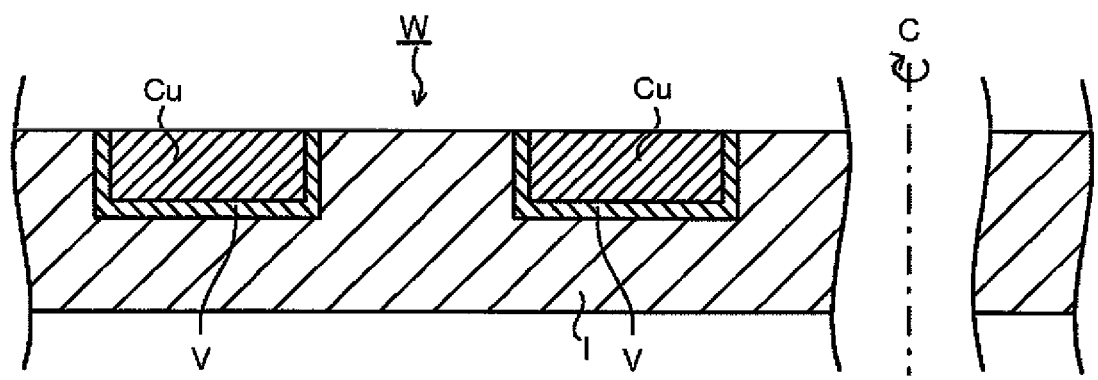
FIGS. 10A to 10D illustrate plating process states on a substrate surface.
Figure 10B:
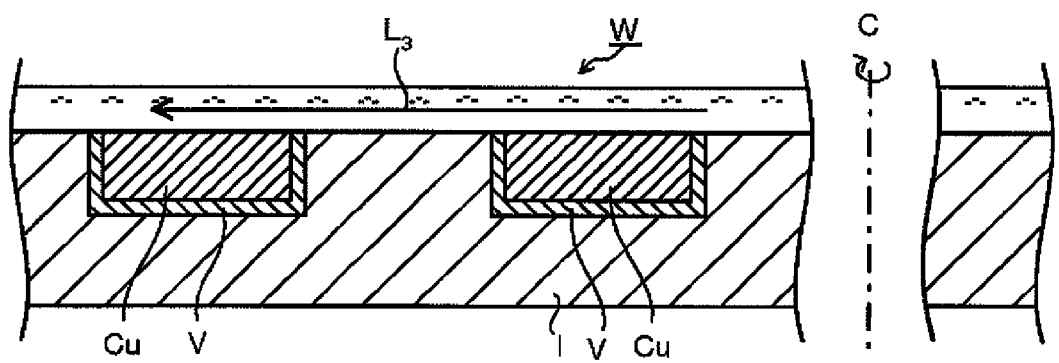
Figure 10C:
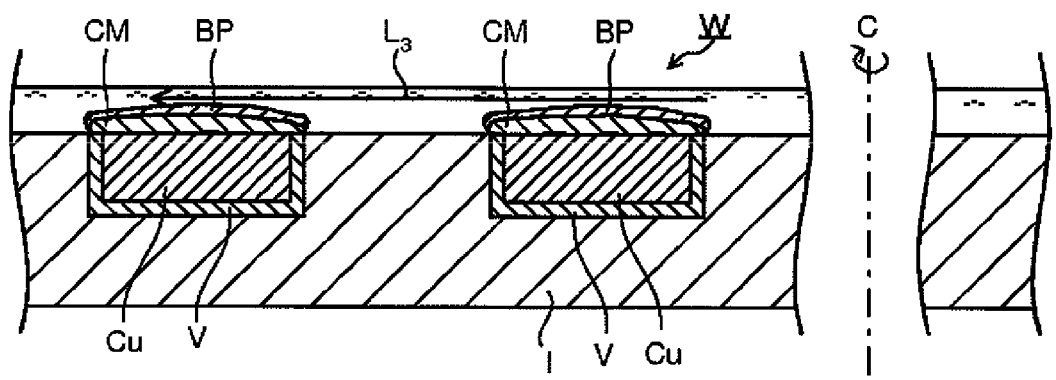
Figure 10D:
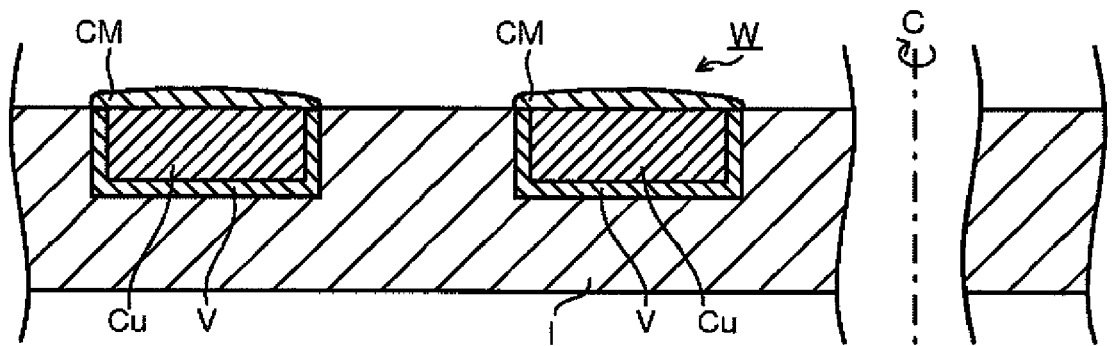

FIGS. 10A to 10D illustrate plating process states on the surface of the substrate W. As shown in FIG. 10A, an insulating film I is formed on the surface of the substrate W, and a barrier metal V is formed in a surface layer portion of the insulating film I, and a copper (Cu) wiring is formed on the surface layer of the insulating film I via the barrier metal V. In the plating unit 11 in accordance with the present embodiment, since the plating solution is supplied while rotating the substrate W after locating the nozzle 144c at the almost midway position between the central portion and the periphery portion of the substrate W, the plating solution $L_3$ is supplied such that it flows on the surface of the substrate W due to the centrifugal force (FIG. 10B). If the plating process progresses, a cap metal CM is formed on a surface of the copper (Cu) wiring, and a by-product BP is also generated on the surface of the substrate W (FIG. 10C). Further, old plating solution $L_3$ containing the by-product BP generated by the plating reaction on the surface of the substrate W is continuously discharged out of the substrate W due to the flow of the plating solution $L_3$. Therefore, it is possible to allow the cap metal (plated film) to grow always with new plating solution without rendering the by-product BP accumulated on the surface of the substrate W (FIG. 10D).

After the plating process B, the process controller 51 conducts the post-cleaning process C. The post-cleaning process C includes a post chemical solution treatment and a pure water process.

The process controller 51 instructs the fluid supply device 200 to perform the post chemical solution treatment (supply process d in FIG. 6). The fluid supply device 200 stops the supply of the pure water $L_0$ by closing the valve 260a, and supplies the post-cleaning processing solution $L_2$ into the nozzle 144b by operating the pump 222 and the valve 223 (S330). The post-cleaning processing solution $L_2$ functions to remove residues on the surface of the substrate W or an abnormally precipitated plated film. The supply amount of the post-cleaning processing solution $L_2$ is sufficient if the substrate surface is prevented from getting dried, and it may be set to be, e.g., about 0.5 to 2.0 L/min. Further, the rotational speed of the substrate W is desirably set to be, e.g., about 100 to 500 rpm because the post-cleaning processing solution $L_2$ needs to be diffused onto the surface of the substrate W sufficiently without allowing the surface of the substrate W to be dried.

After the post chemical solution treatment, the process controller 51 instructs the fluid supply device 200 to perform the pure water process (supply process g in FIG. 7). The fluid supply device 200 stops the supply of the post-cleaning processing solution $L_2$ by operating the pump 222 and the valve 223, and supplies the pure water $L_0$ by opening the valve 260b (S331). The supply amount of pure water is desirably set to be, e.g., about 0.5 to 2.0 L/min, and the rotational speed of the substrate W is desirably set to be, e.g., about 100 to 500 rpm. Further, since the processing time may be sufficient if the plating solution is removed from the surface of the substrate W, it may be set to be, e.g., about 10 to 60 seconds.

After the post-cleaning process C, the process controller 51 performs the rear surface/end surface cleaning process D. The rear surface/end surface cleaning process D includes a liquid removing process, a rear surface cleaning process and an end surface cleaning process.

The process controller 51 instructs the fluid supply device 200 to perform the liquid removing process. The fluid supply device 200 stops the supply of the pure water $L_0$ by closing the valve 260b, and the process controller 51 increases the rotational speed of the substrate W held on the spin chuck 130 (S340). This process aims at removing the liquid on the surface of the substrate W by drying the surface of the substrate W. The rotational speed of the substrate W is set to be as high as, e.g., about 800 to 1000 rpm, and the processing time is desirably set to be, e.g., about 10 to 30 seconds in consideration of the fact that the surface of the substrate W has hydrophilic property.

After the completion of the liquid removing process, the process controller 51 instructs the fluid supply device 200 to perform the rear surface cleaning process. First, the process controller 51 decreases the rotational speed of the substrate W held on the spin chuck 130 (S341). At this time, the rotational speed is set to be relatively low, e.g., about 5 to 20 rpm to prevent a rebound of the processing solution. Thereafter, the fluid supply device 200 supplies pure water into the fluid supply path 171 (supply process a in FIG. 6). The heat exchanger 175 controls the temperature of the pure water sent to the fluid supply path 171 and supplies the temperature-controlled pure water to the rear surface of the substrate W via a flow path provided in the back plate 165 (S342). The pure water functions to hydrophilicize the rear surface side of the substrate W. Subsequently, the fluid supply device 200 stops the supply of the pure water into the fluid supply path 171, and instead supplies a rear surface cleaning solution into the fluid supply path 171 (S343). The rear surface cleaning solution functions to wash away residues on the rear surface side of the substrate W in the plaiting process (supply process c in FIG. 6).

Thereafter, the process controller 51 instructs the fluid supply device 20 and the nozzle driving device 205 to perform the end surface cleaning process. The fluid supply device 200 stops the supply of the rear surface cleaning solution into the rear surface of the substrate W and instead supplies pure water, the temperature of which is controlled by the heat exchanger 175, into the fluid supply path 171 (S344). At this time, it is desirable to set the rotational speed of the substrate W to be relatively low, e.g., about 5 to 20 rpm, thereby preventing the rebound of the pure water (supply process a in FIG. 6).

Subsequently, the nozzle driving device 205 rotates the second arm 152 so as to locate the nozzle 154 at an edge portion of the substrate W by means of driving the second rotation driving mechanism 153, and the process controller 51 increases the rotational speed of the substrate W up to about 150 to 300 rpm (S345). Likewise, the nozzle driving device 205 rotates the first arm 142 so as to locate the nozzle 144b at the central portion of the substrate W by means of operating the first rotation driving mechanism 143. The fluid supply device 200 supplies the pure water $L_0$ into the nozzle 144b by opening the valve 260b, and supplies the outer periphery processing solution $L_4$ into the nozzle 154 by operating the pump 242 and the nozzle 243 (supply processes a and g in FIG. 6). That is, in this state, the pure water $L_0$ and the outer periphery processing solution $L_4$ are supplied to the central portion and the edge portion of the substrate W, respectively, while the temperature-controlled pure water is supplied to the rear surface of the substrate W (S346).

Figure 11A:
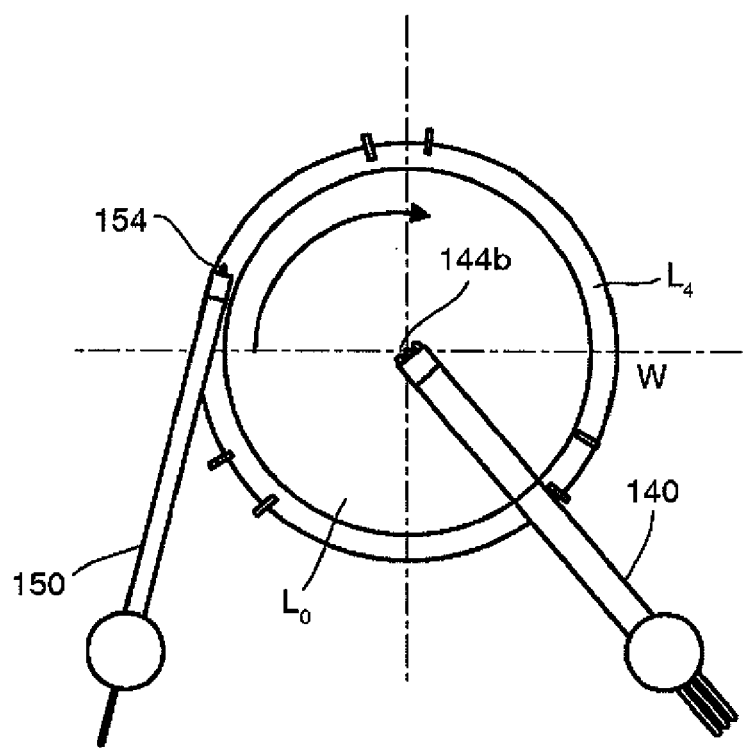
FIG. 11A is a schematic top view of the first fluid supply unit and a second fluid supply unit.
Figure 11B:
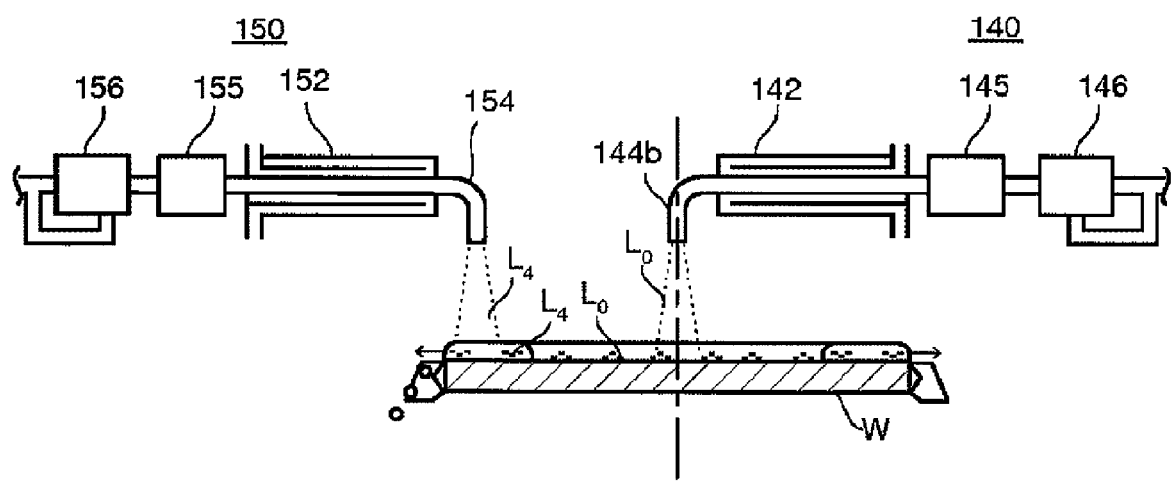
FIG. 11B sets forth a schematic side view of the first and second fluid supply units.

FIGS. 11A and 11B show the state of such end surface cleaning process. FIG. 11A is a schematic top view of the first and second fluid supply units 140 and 150, and FIG. 11B illustrate the state of performing the end surface cleaning process by supplying the pure water $L_0$ and the outer periphery processing solution $L_4$ from the first and second fluid supply units 140 and 150, respectively. As illustrated in FIGS. 11A and 11B, the first arm 142 is moved such that the nozzle 144b is located at the central portion of the substrate W, while the second arm 152 is moved such that the nozzle 154 is located at the periphery portion of the substrate W. Then, the pure water $L_0$ and the outer periphery processing solution $L_4$ are supplied onto the surface of the substrate W from the nozzles 144b and 154, respectively. With such configuration and operation, it becomes possible to remove the residues remaining on the surface and end surface of the substrate W. As the outer periphery processing solution $L_4$ in this end surface cleaning process, hydrofluoric acid or the like can be used, for example.

After the rear surface/end surface cleaning process D, the process controller 51 performs the drying process E. The drying process E includes a drying step.

The process controller 51 instructs the fluid supply device 200 and the nozzle driving device 205 to perform the drying step. The fluid supply device 200 stops the supply of all the processing solutions (S350), and the nozzle driving device 205 retreats the first arm 142 and the second arm 152 from above the substrate W. Further, the process controller 51 increases the rotational speed of the substrate W up to about 800 to 1000 rpm to thereby dry the substrate W (S351). The processing time for the drying process is desirably set to be, for example, about 10 to 30 seconds. After the completion of the drying process, the process controller 51 stops the rotation of the substrate W (S352).

After the completion of the plating process, the transfer arm 14A of the second substrate transfer mechanism 14 takes out the substrate W from the spin chuck 130 through the window 115.

In the plating unit 11 in accordance with the present embodiment, since the plating solution is supplied while the plating solution supply nozzle is being moved on the substrate W in the plating solution substitution process of the plating process B, liquid non-uniformity on the substrate W can be suppressed while preventing the temperature decrease of the plating solution. Furthermore, with the plating unit 11 in accordance with the present embodiment, since the plating solution is supplied discontinuously (intermittently) after locating the plating solution nozzle between the central portion and the end portion of the substrate W, it is possible to supply the plating solution on the surface of the substrate W uniformly while reducing the supply amount of the plating solution.

Figure 12A:
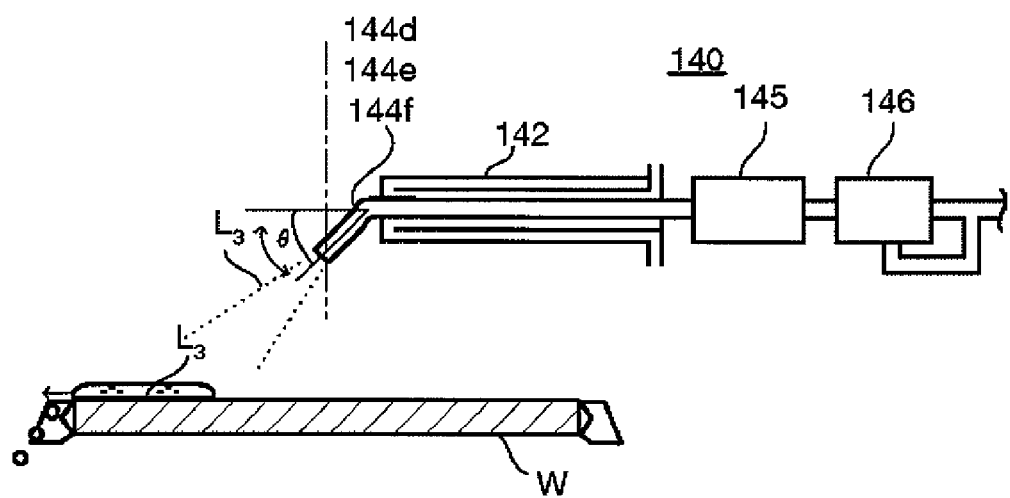
FIGS. 12A and 12B show a modification example of the first fluid supply unit.
Figure 12B:
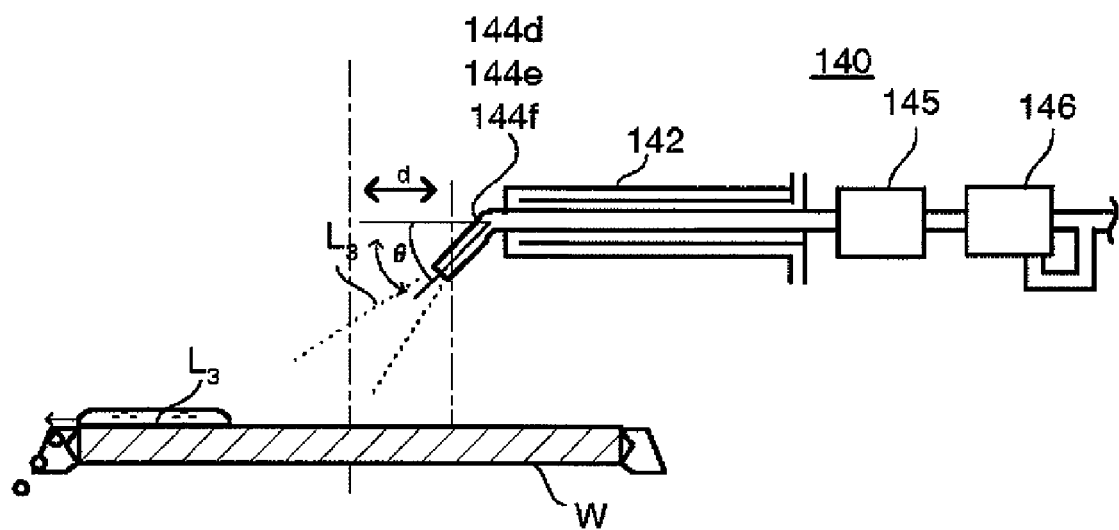
Figure 12C:
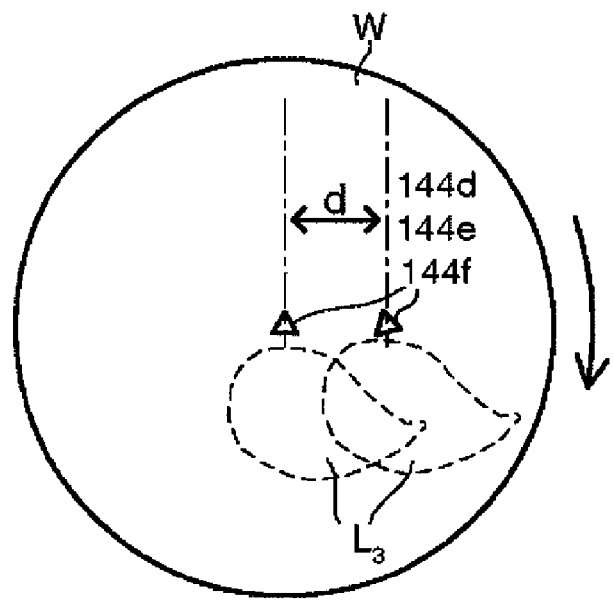
FIG. 12C illustrates a state of a plating process performed by using the modification example of the first fluid supply unit.

Now, a modification example of the nozzle 144 in the semiconductor manufacturing apparatus in accordance with the present embodiment will be explained. FIGS. 12A and 12B show a modification example of the first fluid supply unit 140 in accordance with the present embodiment, and FIG. 12C illustrates a plating process state performed by the modification example of the first fluid supply unit 140. As illustrated in FIG. 12A, the nozzles 144a/144b/144c of the first fluid supply unit 140 are substituted with nozzles 144d/144e/144f oriented toward a direction at a nozzle incline angle θ with respect to the processing target surface direction of the substrate W. In this modification example, since the nozzles for supplying the plating solution $L_3$ and the like are inclined with respect to the processing target surface of the substrate W by the preset nozzle inclination angle θ, the splash of the plating solution $L_3$ can be suppressed, and the plating solution $L_3$ can be supplied onto the surface of the substrate W more uniformly.

Further, the nozzles 144a/144b/144c (or the nozzles 144d/144e/144f) of the first fluid supply unit 140 need not be located at the center of the substrate W. In the semiconductor manufacturing apparatus in accordance with the present embodiment, the plating solution is supplied on the substrate W while rotating the substrate W. Thus, in order to reduce the amount of use of the plating solution or suppress the splash of liquid due to the supply of the plating solution, it may be possible to locate the nozzle 144 apart from the substrate center toward the periphery portion by a distance d, as shown in FIG. 12B. That is, as illustrated in FIG. 12C, more uniform supply of the plating solution on the substrate W can be expected due to the synergy effect of the rotation of the substrate W.

Figure 13:
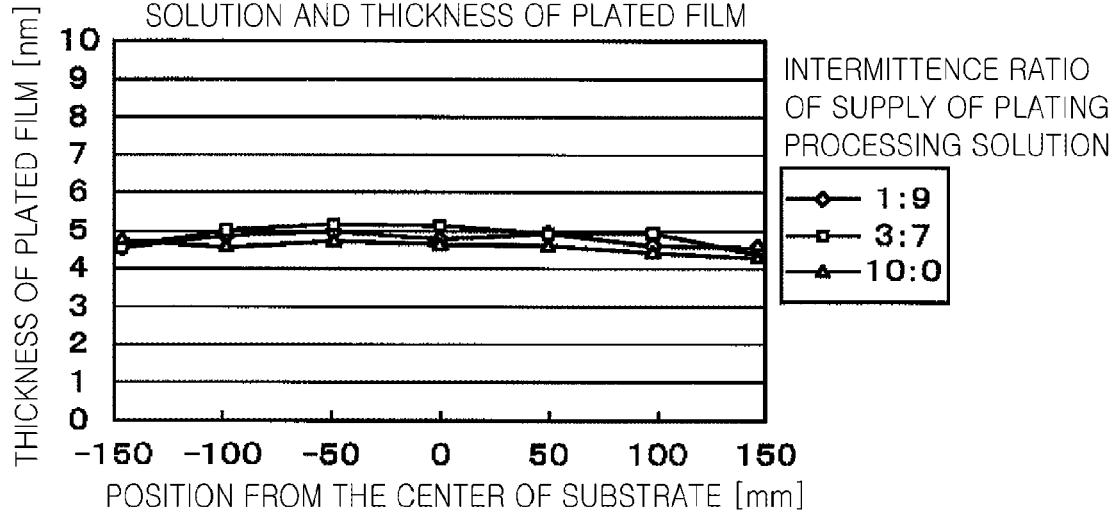
FIG. 13 offers a chart showing a relationship between a discharge interval of a plating processing solution and a thickness of a plated film.
Figure 14:
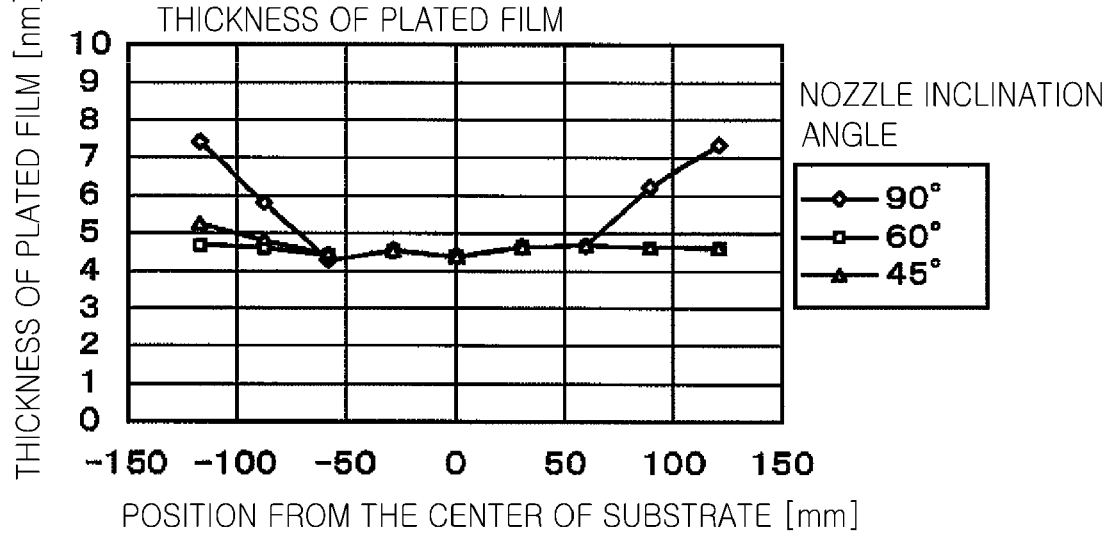
FIG. 14 presents a chart showing a relationship between an inclination angle of a nozzle and a thickness of a plated film.
Figure 15:
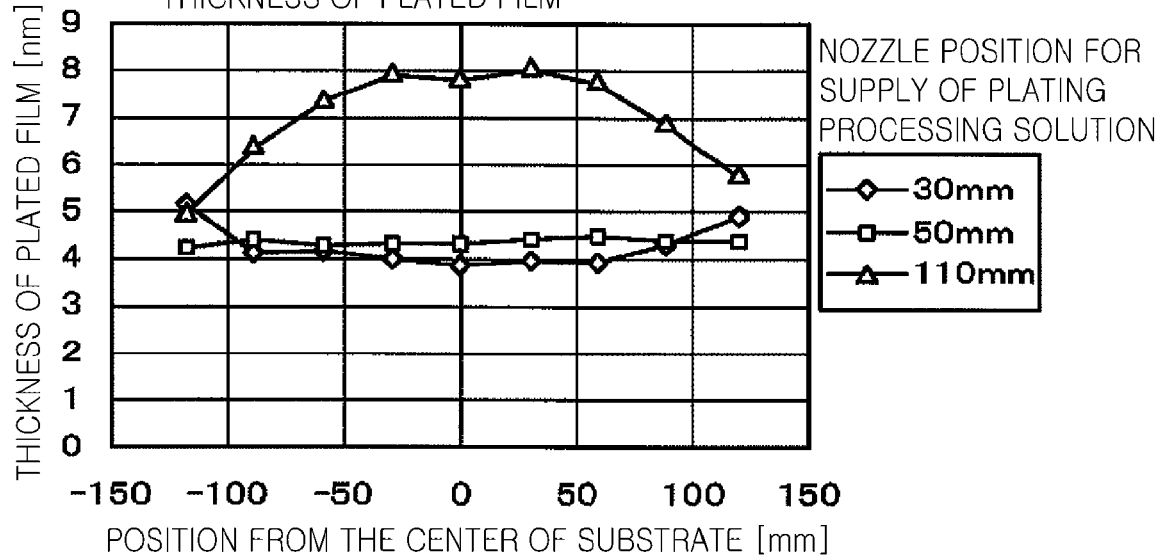
FIG. 15 depicts a chart showing a relationship between a discharge position of a plating solution by the nozzle and a thickness of a plated film.

Now, operation examples of the plating unit 11 in accordance with the present embodiment will be explained with reference to FIGS. 13 to 15. FIG. 13 is a chart showing a relationship between a plating solution discharge interval and a thickness of a plated film in the above-described plating process B, and FIG. 14 provides a chart showing a relationship between a nozzle inclination angle of the nozzle 144c and a thickness of a plated film. FIG. 15 is a chart showing a relationship between a plating solution discharge position by the nozzle 144c and a thickness of a plated film.

In an example shown in FIG. 13, a semiconductor wafer having a size of about 300 mm was used as a substrate W, and the inclination angle of the nozzle 144c is set to be about 60 degrees. At this time, the nozzle 144c is positioned to be located above the substrate W at an almost midway position between the central portion and the periphery portion of the substrate W. In this state, the plating process of the plating process B was performed, and the thickness of a plated film on the substrate W was measured. For comparison, the discharge interval (supply interval) of the plating solution $L_3$ from the nozzle 144c was set such that an on-off ratio (on:off) of the supply became 1:9, 3:7, and 10:0 (consecutive supply), respectively.

As a result, no correlation between the plating solution discharge interval and the thickness of the plated film was found, as can be seen from FIG. 13. This result implies that there is no problem in the uniformity of the film thickness even in case the plating solution is supplied intermittently, not continuously. That is, it becomes possible to save a supply amount of the plating solution by supplying it intermittently.

Further, in an example shown in FIG. 14, a semiconductor wafer having a size of about 300 mm was used as a substrate W, and after locating the nozzle 144c at the approximately midway position between the central portion and the periphery portion of the substrate W, a relationship between the nozzle inclination angle and a thickness of a plated film was investigated for three cases where the nozzle inclination angle of the nozzle 144c was set to be about 45 degrees, 60 degrees and 90 degrees, respectively. Here, the inclination angle is an inclined angle θ of the nozzle with respect to the processing surface of the substrate W, as illustrated in FIG. 10A.

As a result, it was found that the film thickness at the periphery portion of the substrate W became thicker in the cases of the inclination angles of 90 degrees and 45 degrees. Especially, when the inclination angle was 90 degrees (when supplying the plating solution perpendicularly to the substrate W), the film thickness was rapidly increased toward the periphery portion distanced more than about 50 mm away from the center of the substrate W though uniform film thickness was obtained in the range from the center of the substrate W to 50 mm. Such increase of the film thickness at the periphery portion of the substrate W was deemed to be caused because the plating solution was not smoothly discharged from the substrate due to the liquid accumulation effect on the periphery portion of the substrate and by-products remain at the periphery portion. Accordingly, it is desirable to set the nozzle inclination angle to be in a certain angular range with respect to the processing target surface of the substrate W. Furthermore, in the case that the inclination angle was 45 degrees, the increase of the film thickness at a part of the outer periphery portion of the substrate W is deemed to be caused because the plating solution supplied from the nozzle 144c was not diffused on the substrate W sufficiently. As can be seen from these tendencies, it is desirable to set the inclination angle of the nozzle 144c to be equal to or greater than about 45 degrees, more desirably, about 60 degrees or thereabout (about 50 to 70 degrees in an error range of ±10) with respect to the substrate.

Further, in an example shown in FIG. 15, a semiconductor wafer having a size of about 300 mm was used as a substrate W, and the inclination angle of the nozzle 144c was set to be about 45 degrees. Then, a relationship between a nozzle position and a thickness of a plated film was investigated for three cases where the position of the nozzle 144c was set to be about 30 mm, 50 mm, and 110 mm away from the center of the substrate W, respectively. Here, a supply position of a plating processing solution, i.e., the nozzle position is a position distanced from the center of the substrate W by the distance d shown in FIG. 12C. The injection of the plating solution was performed in a direction along the rotation of the substrate W.

As a result, it was found that there was a big difference in the film thickness of the plated film between the central portion and the periphery portion of the substrate W (the film thickness at the central portion was found to be thicker) when the plating solution discharge position of the nozzle 144c was set to be distanced 110 mm apart from the center of the substrate W. Such thickness difference is deemed to be caused because the plating solution spread to the inner periphery portion of the substrate W was dried due to deterioration of the liquid accumulation effect at the periphery portion of the substrate W and then the inner periphery portion was re-coated with the plating solution. Further, when the plating solution discharge position of the nozzle 144c was set to be distanced 30 mm away from the center of the substrate W, a film thickness difference between the central portion and the periphery portion of the substrate W (film thickness at the periphery portion was thicker) was found, though the difference was small. Meanwhile, when the plating solution discharge position of the nozzle 144c was set to be distanced away from the center of the substrate W by 50 mm, uniform film thickness could be obtained in general. From these results, it can be seen that the position of the nozzle 144c when performing the plating process needs to be set to be an almost midway position between the central portion and the periphery portion of the substrate W because the film thickness uniformity is deteriorated when the position is set excessively closer to the central portion or the periphery portion. Specifically, it is desirable to set the distance d to about 30 to 110 mm, more desirably, about 50 mm (30 to 70 mm in an error range of about ±20 mm).

The nozzle inclination angle described so far affects the temperature maintenance of the plating solution actually used in the reaction after supplied on the substrate W and the freshness of the plating solution supplied on the substrate W. During the plating process, it is desirable that the temperature of the plating solution becomes a preset temperature when it makes the reaction after reaching the surface of the substrate W from the nozzle, and such temperature maintenance becomes a big task. In the present embodiment, the inclination of the nozzle prevents the stay of the plating solution on the substrate W, so that the temperature of the plating solution on the surface of the substrate W can be maintained appropriately. Furthermore, by suppressing the stay of the plating solution on the surface of the substrate W, the old plating solution that has been already contributed to the reaction on the substrate can be prevented from being accumulated on the substrate, allowing always new plating solution to be contributed to the plating process on the substrate.

Likewise, the intermittence ratio of the supply of the plating solution also affects the temperature maintenance of the plating solution actually contributed to the reaction after supplied on the substrate W and the freshness of the plating solution supplied on the substrate W. Like the effect of the nozzle inclination angle on the plating process, the stay of the plating solution on the surface of the substrate W can be prevented by intermittently supplying the plating solution in comparison to a case of consecutively supplying the plating solution, and effect of temperature maintenance and refreshment of the plating solution can be expected.

Figure 16A:
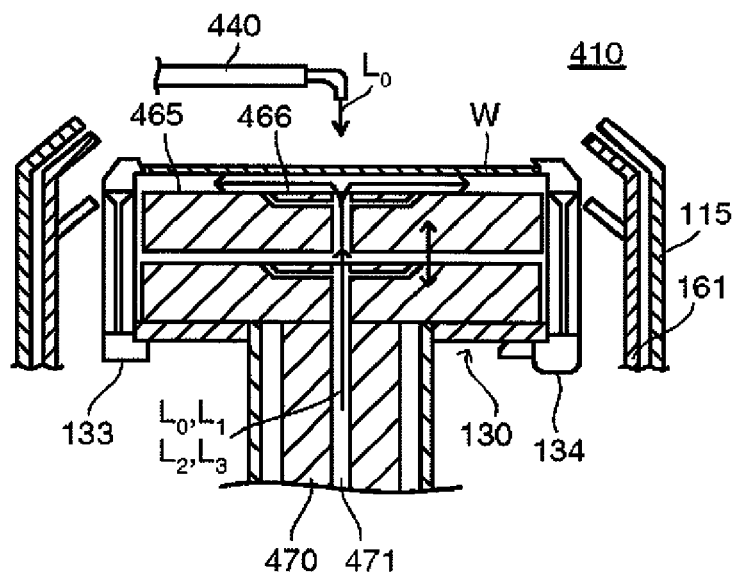
FIG. 16A is a cross sectional configuration view of an electroless plating unit of a semiconductor apparatus in accordance with another embodiment of the present disclosure.
Figure 16B:
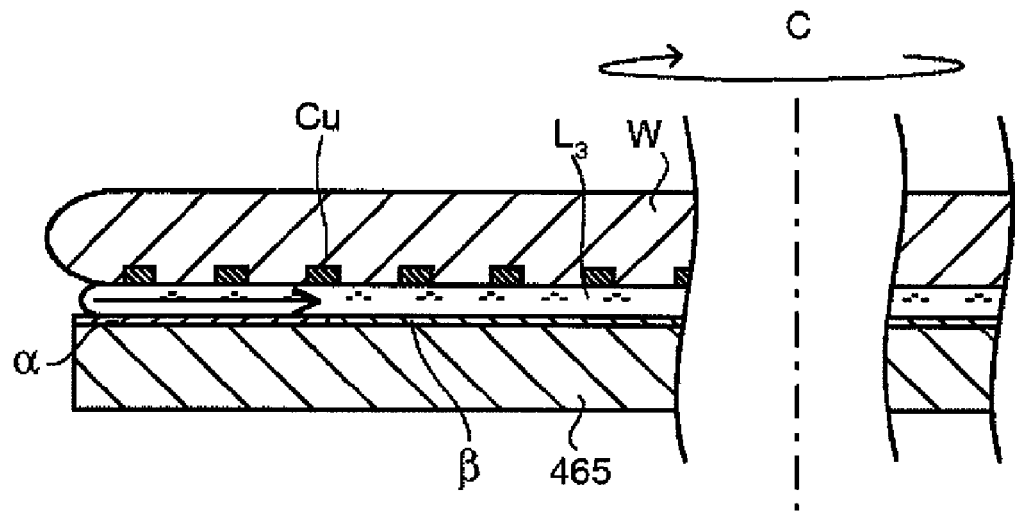
FIGS. 16B and 16C illustrate states of a plating process performed by the electroless plating unit in accordance with another embodiment of the present disclosure.
Figure 16C:
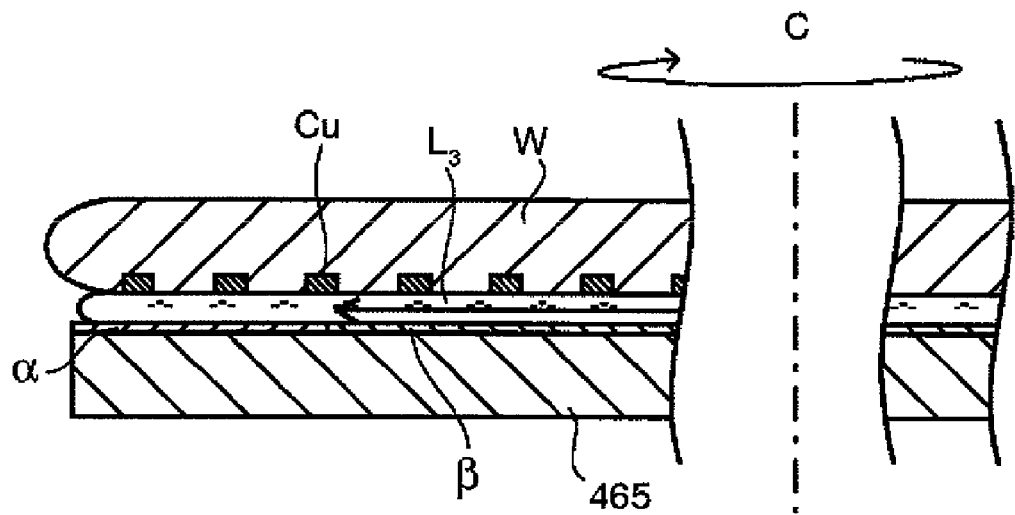

Now, a semiconductor manufacturing apparatus in accordance with another embodiment of the present disclosure will be explained with reference to FIGS. 16A to 16C. FIG. 16A is a cross sectional view of an electroless plating unit of a semiconductor manufacturing apparatus in accordance with another embodiment, and FIGS. 16B and 16C illustrate states of a plating process performed by the electroless plating unit in accordance with another embodiment of the present disclosure. The semiconductor manufacturing apparatus in accordance with this embodiment has the same configuration as that of the semiconductor manufacturing apparatus shown in FIGS. 1 to 3 excepting that the plating solution $L_3$ is supplied through a fluid supply path 171 provided in a shaft 170, not by the first fluid supply unit 140. Here, the same parts as those in the embodiment shown in FIGS. 1 to 3 will be assigned same reference numerals, and redundant description thereof will be omitted. This embodiment is an example in which a face-down method for performing a plating process on a bottom surface of a substrate W is employed.

As illustrated in FIG. 16A, an electroless plating unit 410 in accordance with this embodiment includes a first fluid supply unit 440 and a back plate 465. The first fluid supply unit 440 supplies a processing solution or pure water onto a top surface of the substrate W held by a spin chuck 130. The back plate 465 is disposed between a holding position of the substrate W by the spin chuck 130 and a rotary plate 132, facing the bottom surface of the substrate W held by the spin chuck 130. In this embodiment, the spin chuck 130 holds the substrate W such that the processing target surface of the substrate W faces the back plate 465.

Formed inside the back plate 465 is a flow path 466 opened at a plurality of positions on the surface thereof, and the flow path 466 communicates with a fluid supply path 471 formed through the center of axis of a shaft 470. A non-illustrated heat exchanger is disposed in the fluid supply path 471, and it controls the temperature of a processing fluid such as a plating solution to a preset temperature. That is, the back plate 165 serves to supply the temperature-controlled processing fluid toward the bottom surface of the substrate W. During a plating process, a fluid supply device 200 supplies a pre-cleaning processing solution $L_0$, a post-cleaning processing solution $L_2$ and a plating solution $L_3$ toward the processing target surface (bottom surface) of the substrate W through the fluid supply path 471. Meanwhile, pure water $L_0$ for controlling the temperature of the substrate W is supplied onto the top surface of the substrate W by the first fluid supply unit 440.

The plating process of this embodiment is almost same as the plating process of the embodiment shown in FIG. 5 excepting that the pure water $L_0$, the pre-cleaning processing solution $L_1$, the post-cleaning processing solution $L_2$ and the plating solution $L_3$ is supplied to the bottom surface of the substrate W through the fluid supply path 471 and the first fluid supply unit 440 supplies the temperature-controlled pure water $L_0$ to the top surface of the substrate W. That is, another embodiment is different from the embodiment only in that the target of the plating process is the bottom surface of the substrate W. The back plate 465 is moved up to approach the substrate W when the pre-cleaning processing solution $L_1$, the post-cleaning processing solution $L_2$ and the plating solution $L_3$ are supplied to the bottom surface of the substrate W. That is, these processing fluids are made to flow in a gap between the substrate W and the back plate 465 toward the periphery portion of the substrate W. By the semiconductor manufacturing apparatus in accordance with the present embodiment, since the substrate W is processed by making the processing solution such as the plating solution or the like flow between the substrate W and the back plate 465 positioned close to the substrate W, the amount of use of the plating solution or the like can be reduced.

Here, the back plate 465 of the electroless plating unit 410 in accordance with this embodiment will be explained in detail. As shown in FIGS. 16B and 16C, the back plate 465 in accordance with this embodiment is designed to have different wettabilities for the processing fluid such as the plating solution or the like at the central portion and the periphery portion of its surface. The periphery portion α of the back plate 465 is configured to have lower wettability than its central portion β.

In general, it is known that in case that the wettablity of the surface of the plate such as the back plate 465 for the processing fluid is low, a surface tension of the processing fluid on the plate surface tends to be strong, whereas the processing fluid is easily likely to be diffused onto the plate surface when the wettability is high. As for the back plate 465 in accordance with the present embodiment, since its wettability for the processing fluid is set to be lower in the periphery portion than in the central portion, a force is generated at the periphery portion of the plate in a direction for confining the processing fluid toward the central portion of the plate due to the surface tension of the processing fluid. Further, at the plate central portion, a force is exerted in a direction for diffusing the processing fluid on the surface of the plate. That is, since the forces are exerted in directions marked by arrows in FIGS. 16B and 16C, the processing fluid can be equally diffused within the surface of the back plate 465, so that the entire surface of substrate W can be uniformly wet. Therefore, the plating process on the substrate W can be performed more uniformly.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. Further, various inventions can be conceived by combining a plurality of components described in the present embodiment appropriately. For example, some of the components described in the embodiment can be omitted, and components in different embodiments can be appropriately combined.

Figure 17A:
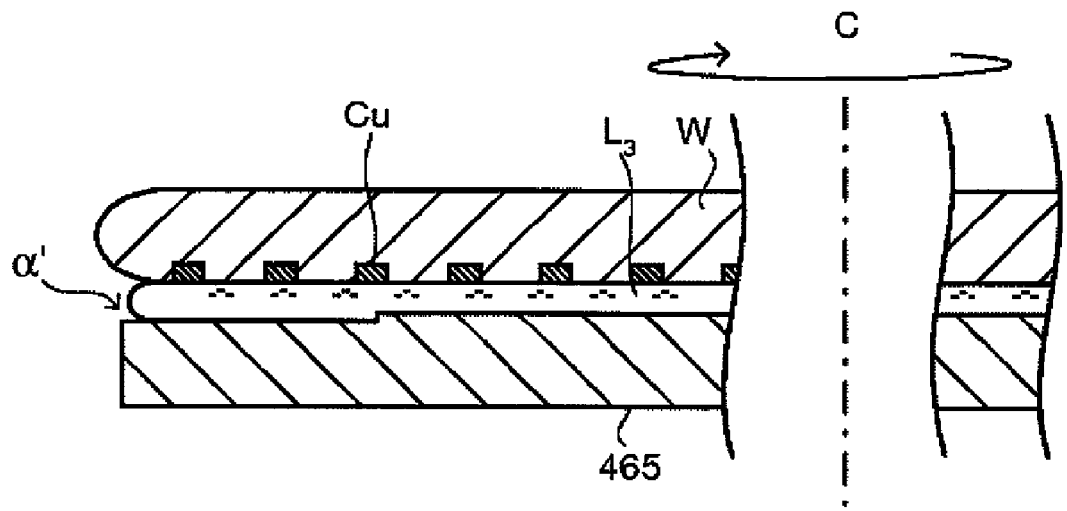
FIGS. 17A and 17B illustrate a modification example of a back plate of the electroless plating unit in accordance with another embodiment of the present disclosure.
Figure 17B:
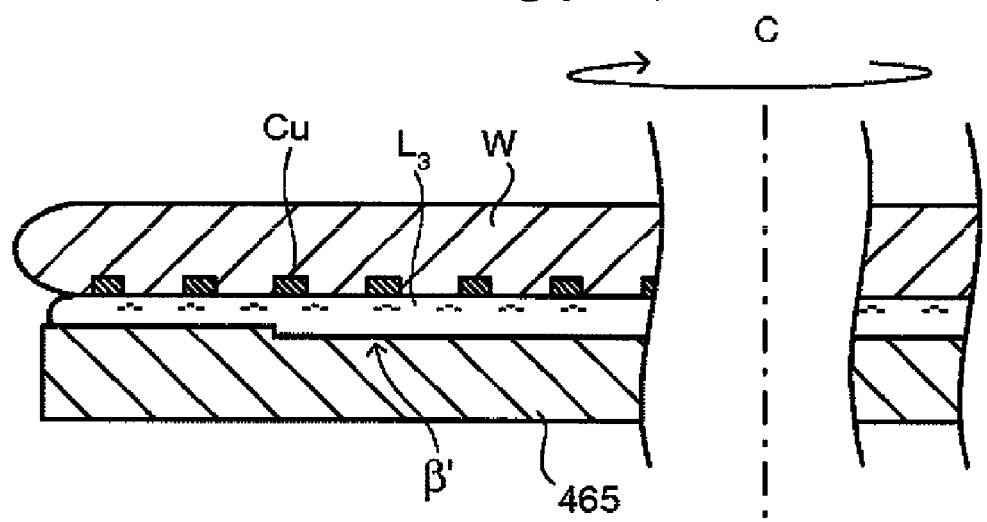

For example, as a means to obtain different surface wettabilities at the central portion and the peripheral portion of the back plate, it is possible to control a force applied from the surface of the back plate to the processing liquid by way of providing a stepped portion to the back plate. FIGS. 17A and 17B illustrate such example of the back plate. As shown in FIGS. 17A and 17B, surface resistance, i.e., wettability, of each of the central portion and the periphery portion of the back plate against the processing fluid can be controlled by providing a stepped portion α of a stepped portion β to the surface of the back plate.

Likewise, the technical conception for differentiating the surface wettabilities of the central portion and the periphery portion of the back plate described in FIGS. 16B and 16C can be applied to the embodiment described in FIGS. 1 to 3. That is, in the pre-cleaning process A, the nozzle 144a of the first fluid supply unit 140 supplies the pure water $L_0$ after moved to the center portion of the substrate W, and the nozzle 154 of the second fluid supply unit 150 supplies the outer periphery processing solution L₄ after moved to the periphery portion of the substrate W, as described above. At this time, by adjusting the outer periphery processing solution L₄ appropriately, the wettabilities of the central portion and the periphery portion of the substrate W can be made different. Through this process, the plating solution can be accumulated on the entire surface of the substrate W uniformly in the plating process B subsequent of the pre-cleaning process A.

INDUSTRIAL APPLICABILITY

The present disclosure has many advantages when it is employed in the field of semiconductor manufacture.

What is claimed is:

1. A semiconductor manufacturing method comprising:
   a first cleaning process of cleaning a processing target surface of a substrate;
   a first plating solution supplying process of continuously supplying a plating solution onto the processing target surface from a nozzle while moving the nozzle between a position facing a central portion of the processing target surface of the substrate washed in the first cleaning process and a position facing a periphery portion thereof;
   a second plating solution supplying process of intermittently supplying the plating solution onto the processing target surface from the nozzle after stopping the nozzle at a preset position facing the processing target surface of the substrate processed by the first plating solution supplying process; and
   a second cleaning process of cleaning the processing target surface of the substrate processed by the first and second plating solution supplying processes.

2. The semiconductor manufacturing method of claim 1, wherein the movement of the nozzle in the first plating solution supplying process includes a first movement and a second movement performed at a first speed and a second speed, which is slower than the first speed, respectively, between the position facing the central portion of the target processing surface of the substrate and the position facing the periphery portion of the target processing surface.

3. The semiconductor manufacturing method of claim 1, wherein in the intermittent supply of the plating solution by the second plating solution supplying process, a time period of supplying the plating solution is set to be longer than a time period of stopping the supply of the plating solution.

4. The semiconductor manufacturing method of claim 1, wherein in the intermittent supply of the plating solution by the second plating solution supplying process, a time period of supplying the plating solution is set to be shorter than a time period of stopping the supply of the plating solution.

5. The semiconductor manufacturing method of claim 1, wherein the intermittent supply of the plating solution by the second plating solution supplying process is performed after locating the nozzle at an approximately center position of the substrate.

6. The semiconductor manufacturing method of claim 1, wherein the intermittent supply of the plating solution by the second plating solution supplying process is performed after locating the nozzle at a position distanced away from an approximately center position of the substrate by about 30 to 110 mm.

7. The semiconductor manufacturing method of claim 1, wherein the intermittent supply of the plating solution by the second plating solution supplying process is performed after locating the nozzle at a position distanced away from an approximately center position of the substrate by about 30 to 70 mm.

8. The semiconductor manufacturing method of claim 1, wherein the nozzle supplies the plating solution at an inclination angle of about 45 to 90 degrees with respect to the processing target surface of the substrate.

9. The semiconductor manufacturing method of claim 1, wherein the nozzle supplies the plating solution at an inclination angle of about 50 to 70 degrees with respect to the processing target surface of the substrate.

10. The semiconductor manufacturing method of claim 2, wherein the movement of the nozzle in the first plating solution supplying process includes the first movement at least two times.

11. The semiconductor manufacturing method of claim 2, wherein the first movement includes a movement performed at a third speed from the position facing the central portion of the processing target surface of the substrate to the position facing the periphery portion of the processing target substrate; and a movement performed at a fourth speed, which is faster than the third speed, from the position facing the periphery portion of the processing target surface to the position facing the central portion thereof.

* * * * *

UNITED STATES PATENT AND TRADEMARK OFFICE
CERTIFICATE OF CORRECTION

| | | |
|---|---|---|
| PATENT NO. | : 8,003,509 B2 | Page 1 of 1 |
| APPLICATION NO. | : 12/405644 | |
| DATED | : August 23, 2011 | |
| INVENTOR(S) | : Kenichi Hara et al. | |

It is certified that error appears in the above-identified patent and that said Letters Patent is hereby corrected as shown below:

In column 19, line 46, replace "$L_0$" with -- $L_1$ --

Signed and Sealed this
Eighth Day of November, 2011

David J. Kappos
*Director of the United States Patent and Trademark Office*